United States Patent
Yahashi et al.

(10) Patent No.: US 8,294,199 B2
(45) Date of Patent: Oct. 23, 2012

(54) NONVOLATILE SEMICONDUCTOR MEMORY DEVICE AND METHOD FOR MANUFACTURING THE SAME

(75) Inventors: Katsunori Yahashi, Mie-ken (JP); Masaru Kidoh, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 12/886,132

(22) Filed: Sep. 20, 2010

(65) Prior Publication Data

US 2012/0018796 A1 Jan. 26, 2012

(30) Foreign Application Priority Data

Jul. 22, 2010 (JP) ................................. 2010-165365

(51) Int. Cl.
*H01L 29/792* (2006.01)
*H01L 21/3205* (2006.01)
(52) U.S. Cl. ......... 257/324; 257/E29.309; 257/E21.158; 438/589
(58) Field of Classification Search ............... 257/324, 257/E29.309, E21.158; 438/589
See application file for complete search history.

(56) References Cited

U.S. PATENT DOCUMENTS

| | | | |
|---|---|---|---|
| 6,727,544 B2 | 4/2004 | Endoh et al. | |
| 6,870,215 B2 | 3/2005 | Endoh et al. | |
| 2007/0252201 A1 | 11/2007 | Kito et al. | |
| 2009/0283819 A1 | 11/2009 | Ishikawa et al. | |
| 2010/0207195 A1 | 8/2010 | Fukuzumi et al. | |
| 2010/0320526 A1* | 12/2010 | Kidoh et al. | 257/324 |
| 2012/0001250 A1* | 1/2012 | Alsmeier | 257/319 |

FOREIGN PATENT DOCUMENTS

JP 2009-146954 7/2009

OTHER PUBLICATIONS

U.S. Appl. No. 12/718,641, filed Mar. 5, 2010, Yahashi.
U.S. Appl. No. 12/818,005, filed Jun. 17, 2010, Ishikawa.
U.S. Appl. No. 12/943,349, filed Nov. 10, 2010, Katsumata, et al.
U.S. Appl. No. 12/839,895, filed Jul. 20, 2010, Yoshiaki Fukuzumi, et al.
U.S. Appl. No. 12/727,830, filed Mar. 19, 2010, Tomoko Fujiwara, et al.
H. Tanaka, et al. "Bit Cost Scalable Technology with Punch and Plug Process for Ultra High Density Flash Memory." Symp. on VLSI Tech, Dig. 2007. Pages 14-15.

* cited by examiner

*Primary Examiner* — Lex Malsawma
(74) *Attorney, Agent, or Firm* — Oblon, Spivak, McClelland, Maier & Neustadt, L.L.P.

(57) ABSTRACT

According to one embodiment, a nonvolatile semiconductor memory device includes first and second stacked structures, first and second semiconductor pillars, first and second memory units, and a semiconductor connection portion. The stacked structures include electrode films and first inter-electrode insulating films alternately stacked in a first direction. The second stacked structure is aligned with the first stacked structure in a second direction perpendicular to the first. The first and second semiconductor pillars pierce the first and second stacked structures, respectively. The first and second memory units are provided between the electrode films and the semiconductor pillar, respectively. The semiconductor connection portion connects the first and second semiconductor pillars and includes: an end connection portion; and a first protrusion having a side face continuous with a side face of the first semiconductor pillar. The semiconductor connection portion does not include a portion smaller than a diameter of the first semiconductor pillar.

20 Claims, 30 Drawing Sheets

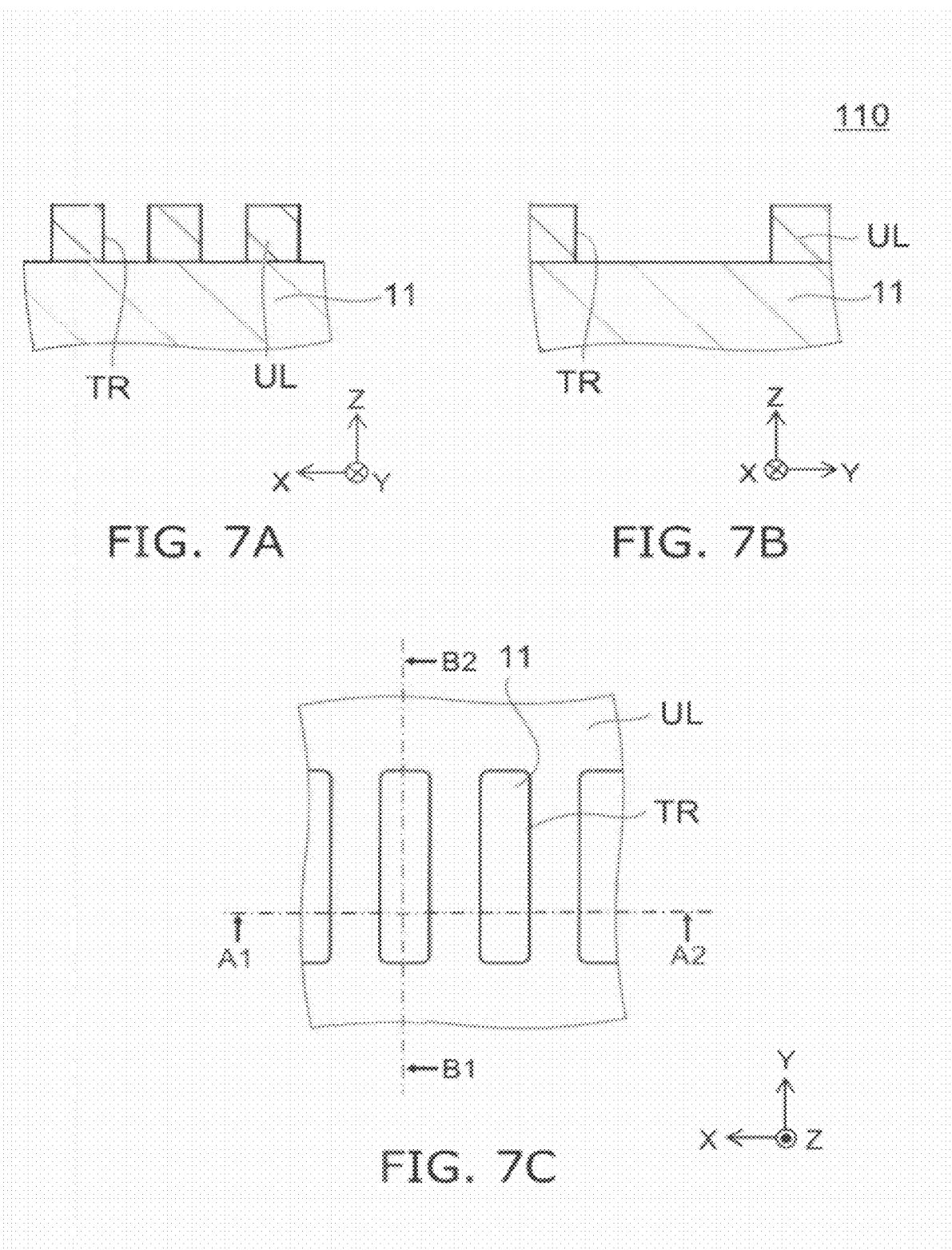

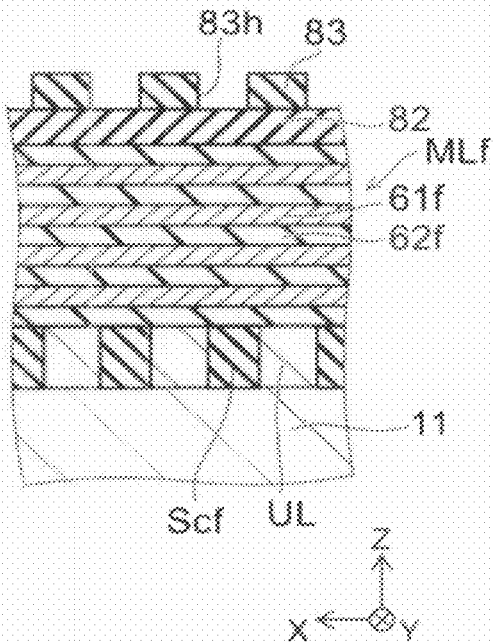
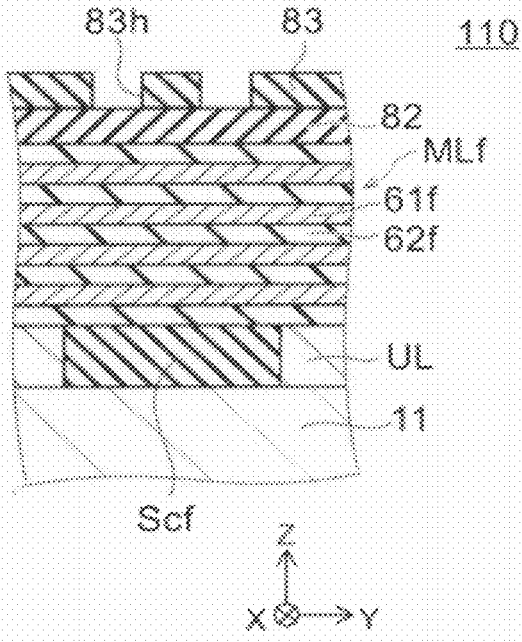
FIG. 9A        FIG. 9B
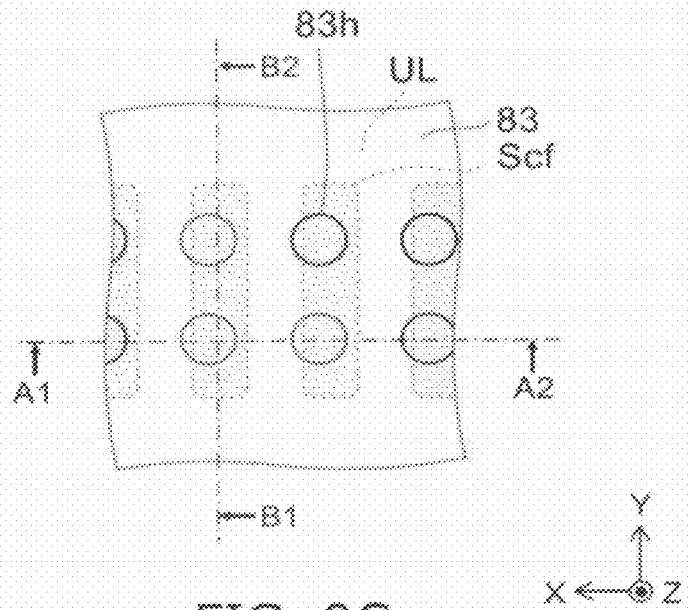
FIG. 9C

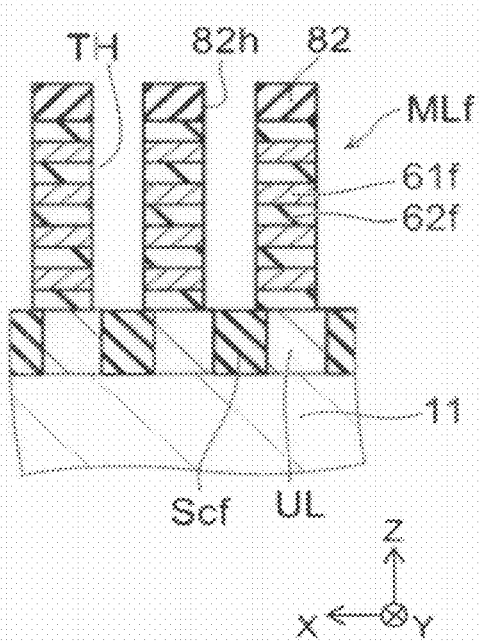
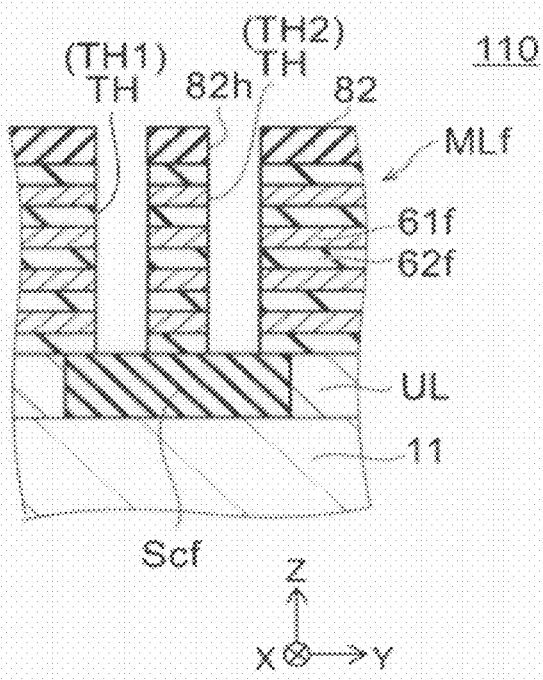
FIG. 11A  FIG. 11B
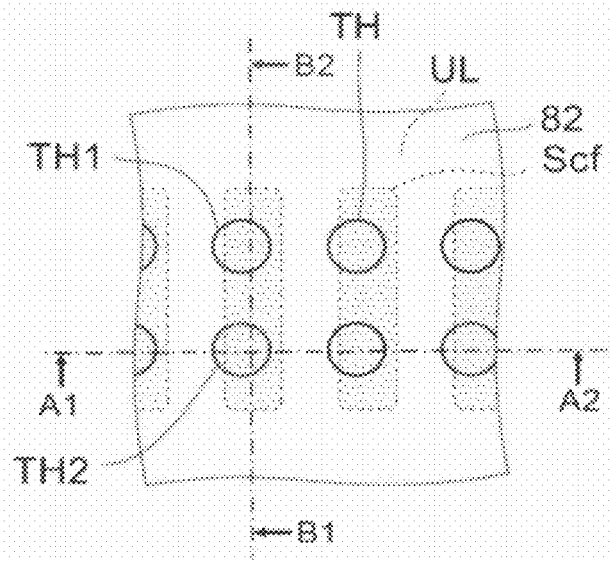
FIG. 11C

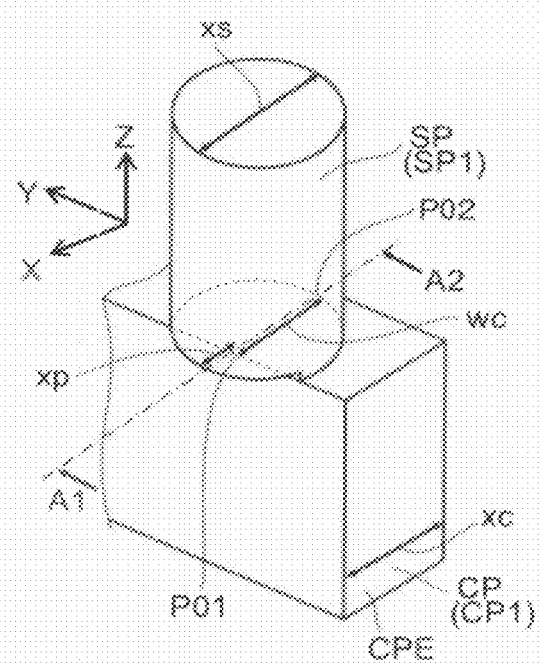
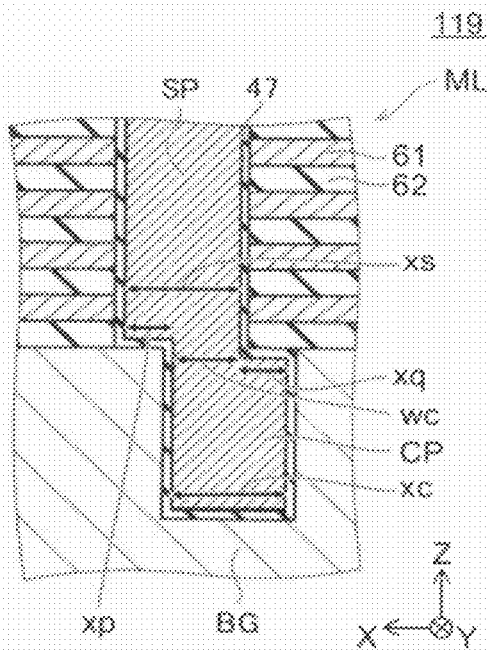
FIG. 26A    FIG. 26B
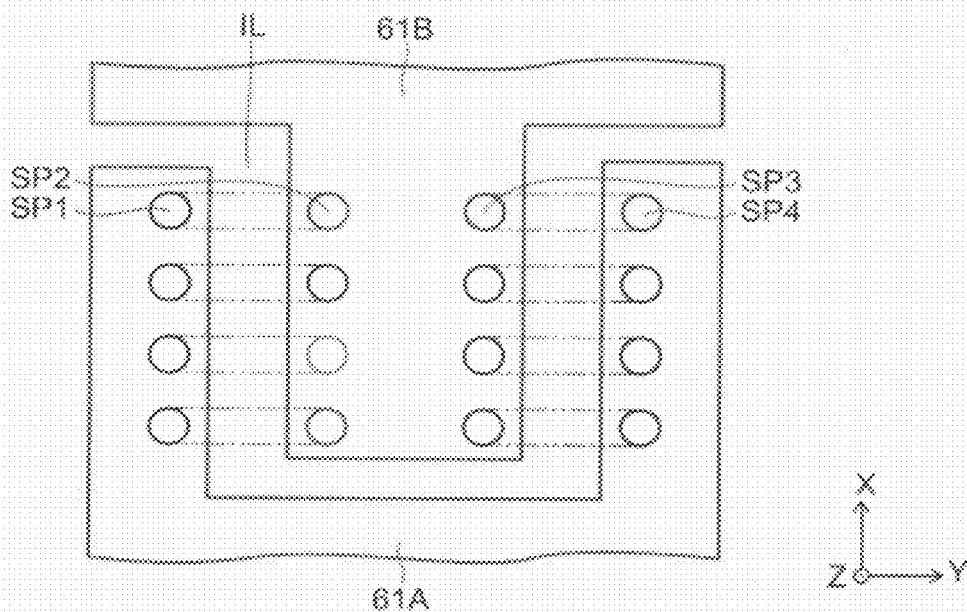
FIG. 27

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2010-165365, filed on Jul. 22, 2010; the entire contents of which are incorporated herein by reference.

FIELD

Embodiments described herein relate generally to a nonvolatile semiconductor memory device and a method for manufacturing the same.

BACKGROUND

In conventional nonvolatile semiconductor memory devices, elements have been integrated in a two-dimensional plane on a silicon substrate. Although the dimensions of one element have been reduced in order to increase the memory capacity of memory, such downscaling is becoming difficult these days in terms of cost and technology.

In contrast, collectively processed three-dimensionally stacked memory is presented. The collectively processed three-dimensionally stacked memory includes a stacked structure body including alternately stacked insulating films and electrode films, silicon pillars piercing the stacked structure body, and charge storage layers (memory layers) between the silicon pillars and the electrode films. Thereby, a memory cell is provided at the intersection of the silicon pillar and each electrode film. Further, also a configuration is presented using a memory string having a U-shaped configuration in which two silicon pillars are connected on the substrate side.

The collectively processed three-dimensionally stacked memory like this leaves room for improvement to expand the allowable margin of mask alignment accuracy and dimensional accuracy to increase productivity.

BRIEF DESCRIPTION OF THE DRAWINGS

FIG. 6A, FIG. 6B, and FIG. 6C to FIG. 15A, FIG. 15B, and FIG. 15C are schematic cross-sectional views in order of the processes, illustrating the method for manufacturing the nonvolatile semiconductor memory device according to the first embodiment;

FIG. 16A, FIG. 16B, and FIG. 16C to FIG. 18A, FIG. 18B, and FIG. 18C are schematic cross-sectional views in order of the processes, illustrating a method for manufacturing a nonvolatile semiconductor memory device of a comparative example;

FIG. 26A and FIG. 26B are schematic views illustrating the configuration of the nonvolatile semiconductor memory device of the comparative example;

FIG. 27 is a schematic plan view illustrating the configuration of an electrode film of the nonvolatile semiconductor memory device according to the first embodiment;

DETAILED DESCRIPTION

Figure 1:
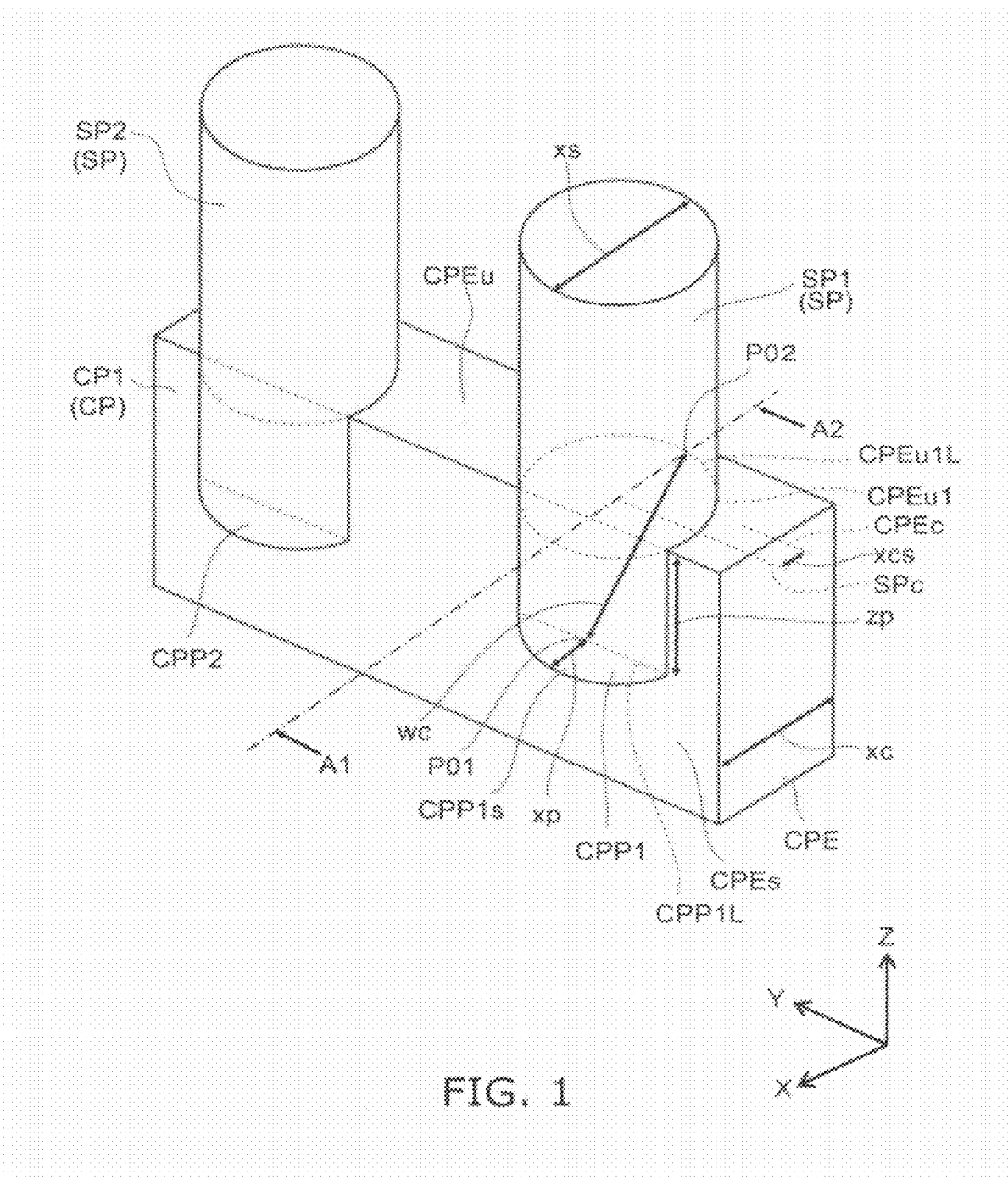
FIG. 1 is a schematic perspective view illustrating the configuration of a relevant part of a nonvolatile semiconductor memory device according to a first embodiment.

In general, according to one embodiment, a nonvolatile semiconductor memory device includes a first stacked structure body, a second stacked structure body, a first semiconductor pillar, a second semiconductor pillar, a first memory unit, a second memory unit and a semiconductor connection portion. The first stacked structure body includes a plurality of first electrode films and a plurality of first inter-electrode insulating films alternately stacked in a first direction. The second stacked structure body is aligned with the first stacked structure body in a direction perpendicular to the first direction and includes a plurality of second electrode films and a plurality of second inter-electrode insulating films alternately stacked in the first direction. The first semiconductor pillar pierces the first stacked structure body along the first direction. The second semiconductor pillar pierces the second stacked structure body along the first direction and is aligned with the first semiconductor pillar along a second direction perpendicular to the first direction. The first memory unit is provided between the plurality of first electrode films and the first semiconductor pillar. The second memory unit is provided between the plurality of second electrode films and the second semiconductor pillar. The semiconductor connection portion connects one end of the first semiconductor pillar and one end of the second semiconductor pillar. The semiconductor connection portion includes an end connection portion having a connection portion side face along the second direction, and a first protrusion protruding at the connection portion side face in a direction intersecting with the first direction and having a side face continuous with a side face of the first semiconductor pillar along the first direction. The semiconductor connection portion does not include a portion smaller than a diameter of the first semiconductor pillar. According to one embodiment, a method is disclosed for manufacturing a nonvolatile semiconductor memory device including a first stacked structure body, a second stacked structure body, a first semiconductor pillar, a second semiconductor pillar, a first memory unit, a second memory unit and a semiconductor connection portion. The first stacked structure body includes a plurality of first electrode films and a plurality of first inter-electrode insulating films alternately stacked in a first direction. The second stacked structure body is aligned with the first stacked structure body in a direction perpendicular to the first direction and includes a plurality of second electrode films and a plurality of second inter-electrode insulating films alternately stacked in the first direction. The first semiconductor pillar pierces the first stacked structure body along the first direction. The second semiconductor pillar pierces the second stacked structure body along the first direction and is aligned with the first semiconductor pillar along a second direction perpendicular to the first direction. The first memory unit is provided between the plurality of first electrode films and the first semiconductor pillar. The second memory unit is provided between the plurality of second electrode films and the second semiconductor pillar. The semiconductor connection portion connects one end of the first semiconductor pillar and one end of the second semiconductor pillar. The method can include forming an underlayer on a substrate. The method can include forming a trench in a region of the underlayer in which the semiconductor connection portion is to be formed and burying a sacrifice layer in the trench. The method can include forming a stacked film serving as the first stacked structure body and the second stacked structure body on the underlayer and the sacrifice layer. The method can include forming a first through hole pierces the stacked film along the first direction in a position corresponding to the first semiconductor pillar and reaching the sacrifice layer and a second through hole pierces the stacked film along the first direction in a position corresponding to the second semiconductor pillar and reaching the sacrifice layer. The method can include removing at least a part of the underlayer exposed from the first through hole to form a first additional hole and removing at least a part of the underlayer exposed from the second through hole to form a second additional hole. The method can include removing the sacrifice layer via the first through hole and the second through hole to form a memory hole including the first through hole, the second through hole, the trench, the first additional hole, and the second additional hole. In addition, the method can include forming an insulating film serving as the first memory unit and the second memory unit on a wall face of the memory hole and forming a semiconductor layer serving as the first semiconductor pillar, the second semiconductor pillar, and the semiconductor connection portion in a remaining space of the memory hole. The memory hole does not include a portion smaller than a diameter of the first through hole.

Embodiments will now be described with reference to the drawings.

The drawings are schematic or conceptual; and the relationships between the thickness and width of portions, the proportional coefficients of sizes among portions, etc. are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with the same reference numerals, and a detailed description is omitted as appropriate.

First Embodiment

FIG. 1 is a schematic perspective view illustrating the configuration of a relevant part of a nonvolatile semiconductor memory device according to a first embodiment.

Figure 2:
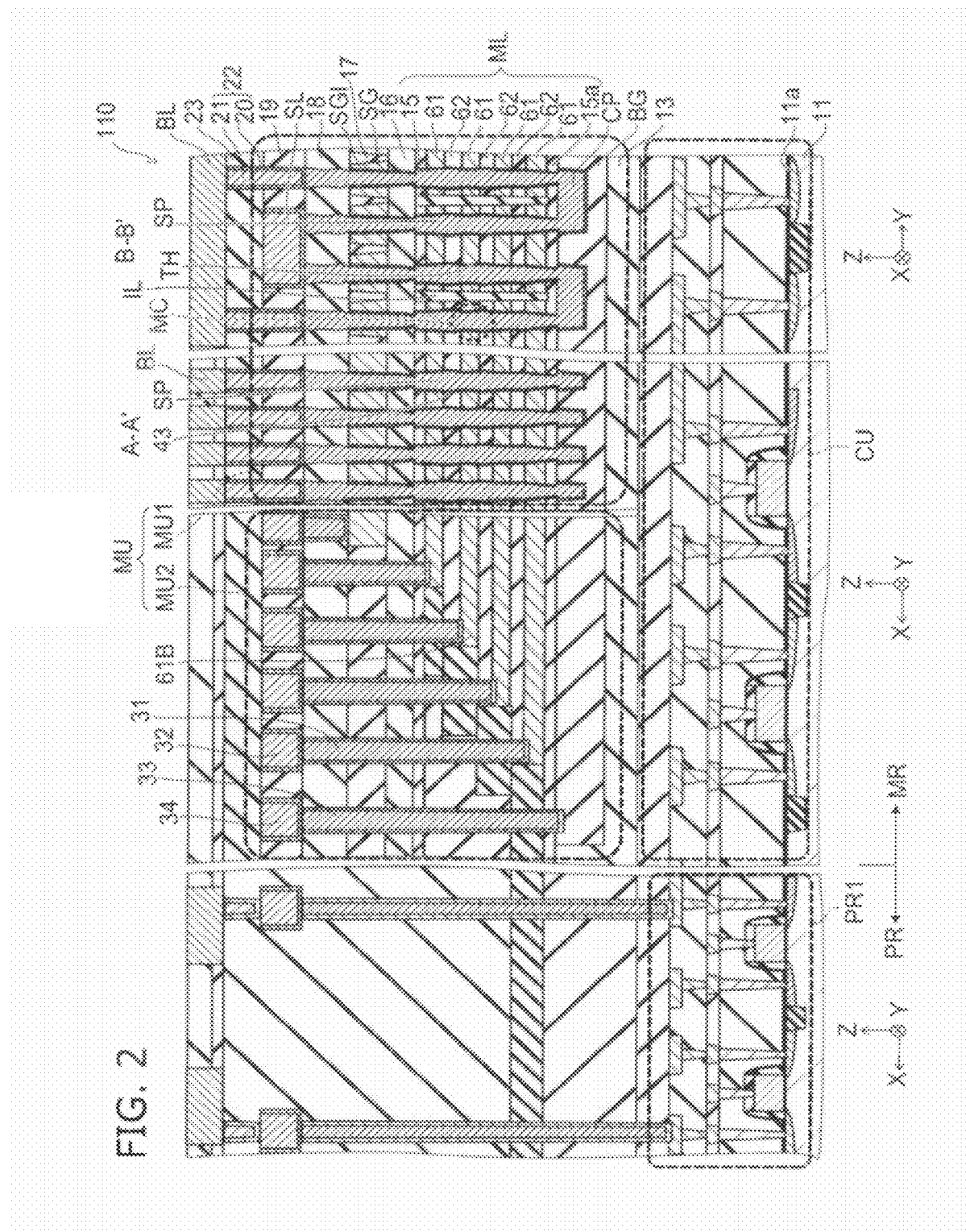
FIG. 2 is a schematic cross-sectional view illustrating the whole configuration of the nonvolatile semiconductor memory device according to the first embodiment.

FIG. 2 is a schematic cross-sectional view illustrating the whole configuration of the nonvolatile semiconductor memory device according to the first embodiment.

Figure 3:
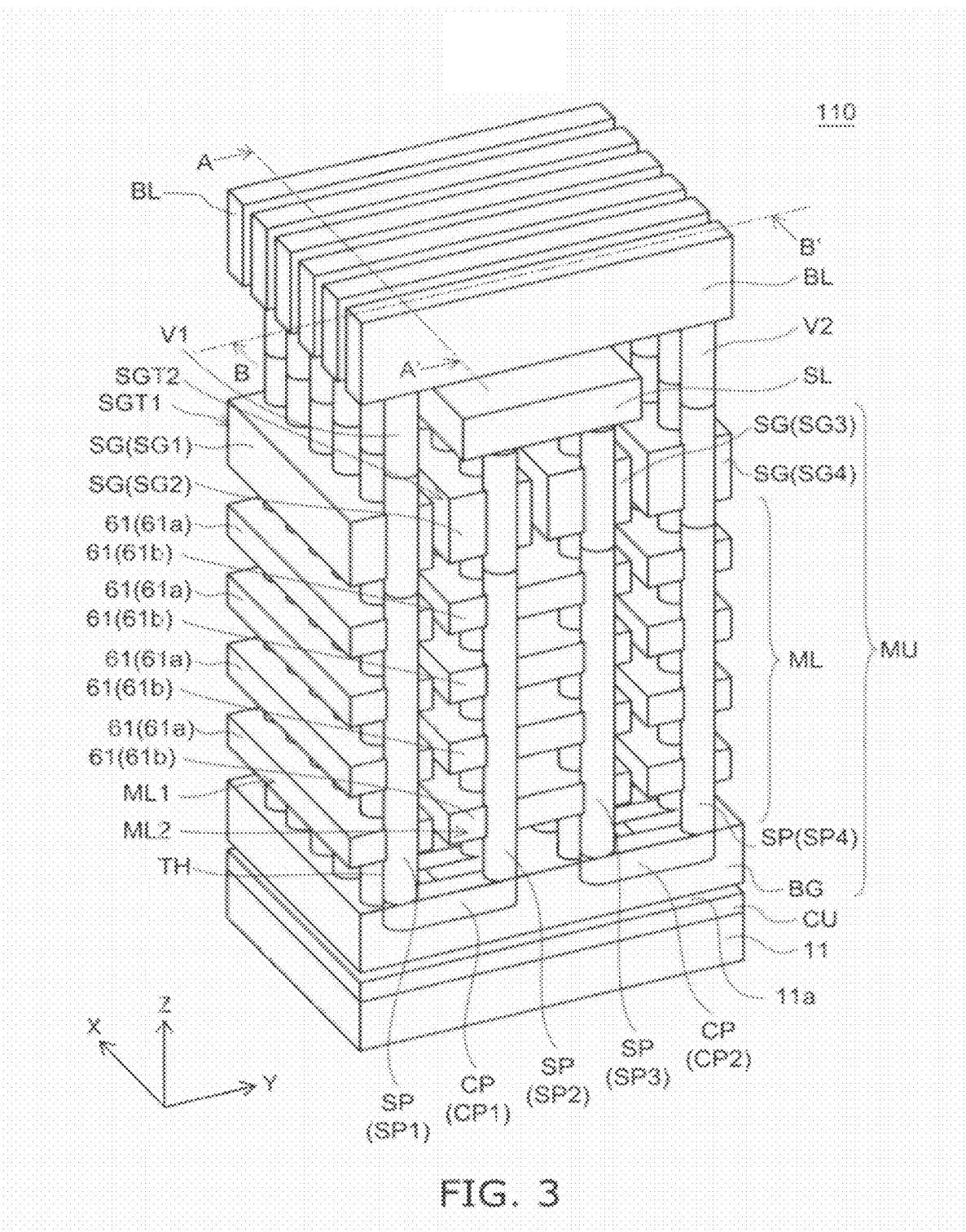
FIG. 3 is a schematic perspective view illustrating the configuration of the nonvolatile semiconductor memory device according to the first embodiment.

FIG. 3 is a schematic perspective view illustrating the configuration of the nonvolatile semiconductor memory device according to the first embodiment.

For easier viewing of the drawing, FIG. 3 illustrates only conductive portions and omits insulating portions.

Figure 4:
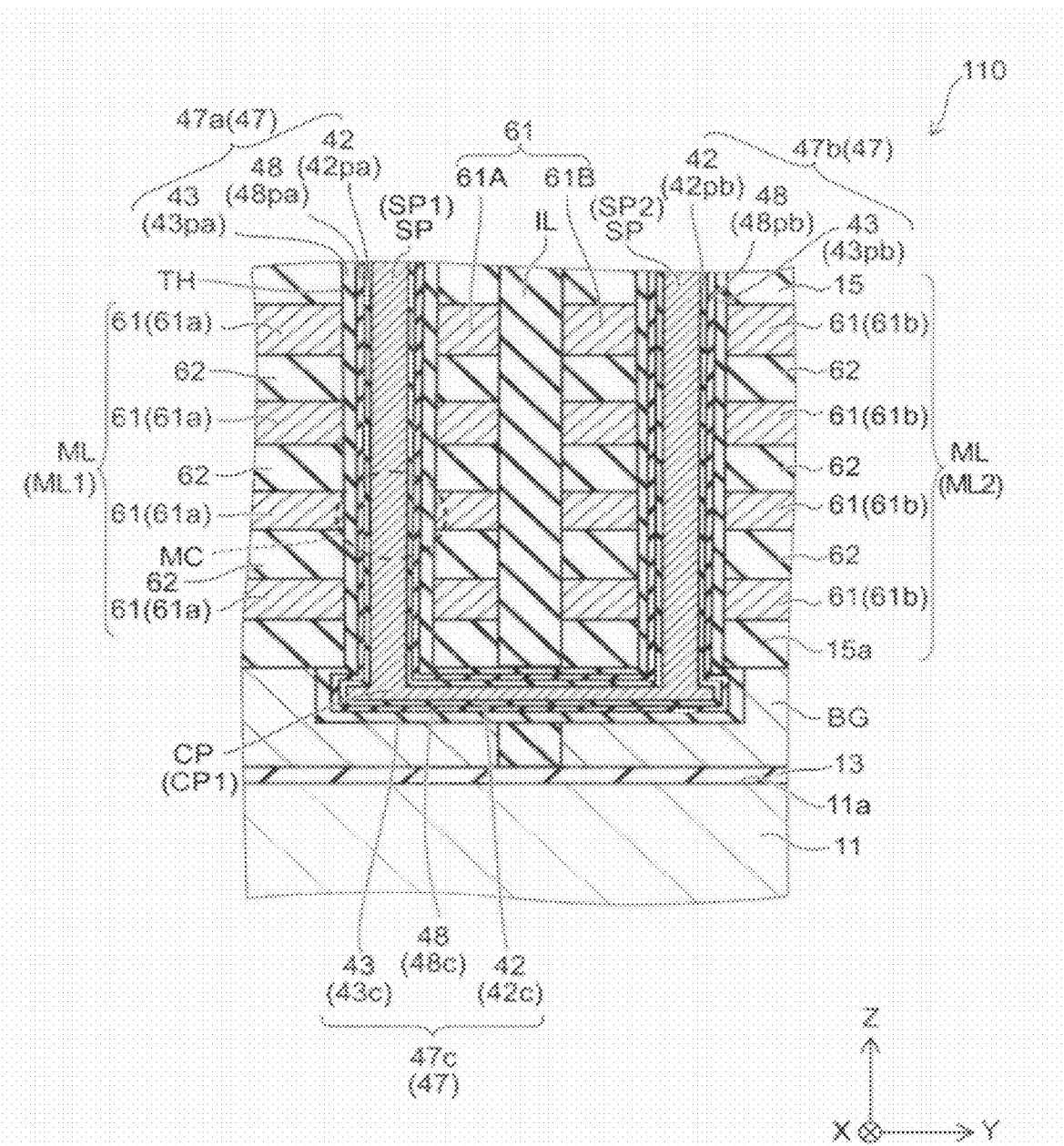
FIG. 4 is a schematic cross-sectional view illustrating the configuration of a part of the nonvolatile semiconductor memory device according to the first embodiment.

FIG. 4 is a schematic cross-sectional view illustrating the configuration of a part of the nonvolatile semiconductor memory device according to the first embodiment.

As illustrated in FIG. 2, a nonvolatile semiconductor memory device 110 includes a semiconductor substrate 11 (substrate). Single crystal silicon, for example, is used for the semiconductor substrate 11. In a major surface 11a of the semiconductor substrate 11, for example, a memory array region MR in which memory cells are formed and a periphery circuit region PR provided, for example, around the memory array region MR are set. The periphery circuit region PR is described later.

In the memory array region MR, for example, a circuit unit CU is provided on the semiconductor substrate 11 and a memory unit MU is provided on the circuit unit CU. The circuit unit CU is provided as necessary and may be omitted. An interlayer insulating film 13 made of, for example, silicon oxide is provided between the circuit unit CU and the memory unit MU.

The memory unit MU includes, for example, a matrix memory cell unit MU1 and an interconnection connecting unit MU2. The matrix memory cell unit MU1 includes memory cell transistors arranged in a three-dimensional matrix form. The interconnection connecting unit MU2 is described later.

Hereinbelow, the matrix memory cell unit MU1 is described.

FIG. 3 illustrates the configuration of the matrix memory cell unit MU1.

FIG. 2 illustrates a part of the cross section along line A-A' of FIG. 3 and a part of the cross section along line B-B' of FIG. 3 as the matrix memory cell unit MU1.

As illustrated in FIG. 2 and FIG. 3, in the matrix memory cell unit MU1, a stacked structure body ML is provided on the major surface 11a of the semiconductor substrate 11.

The stacked structure body ML includes a plurality of electrode films 61 and a plurality of inter-electrode insulating films 62 alternately stacked in a first direction. The inter-electrode insulating film 62 functions as an interlayer insulating film insulating the electrode films 61 from each other.

In the specification of the application, the "stack" includes not only being stacked directly but also being stacked via other components.

The stack direction of the electrode films 61 and the inter-electrode insulating films 62 in the stacked structure body ML is taken as a Z-axis direction (first direction). In this specific example, the Z-axis direction is the direction perpendicular to the major surface 11*a* of the semiconductor substrate 11. One direction perpendicular to the Z-axis direction is taken as a Y-axis direction (second direction). The direction perpendicular to the Z-axis direction and the Y-axis direction is taken as an X-axis direction (third direction).

The electrode film 61 includes, for example, a strip-shaped portion extending along a direction perpendicular to the Z-axis direction. In this specific example, the direction in which the electrode film 61 extends is the X-axis direction Although FIG. 2 and FIG. 3 illustrate four electrode films 61, the number of electrode films 61 provided in the stacked structure body ML is arbitrary.

As illustrated in FIG. 2, an insulating film 15*a* may be provided below the lowermost electrode film 61 (for example, on the side nearest to the semiconductor substrate 11) of the stacked structure body ML. Also the insulating film 15*a* may be included in the stacked structure body ML. Furthermore, an insulating film 15 may be provided on the uppermost electrode film 61 (for example, on the side farthest from the semiconductor substrate 11) of the stacked structure body ML. Also the insulating film 15 may be included in the stacked structure body ML. Silicon oxide, for example, may be used for the insulating films 15 and 15*a*. However, the embodiment is not limited thereto, but the materials of the insulating films 15 and 15*a* are arbitrary.

Semiconductor pillars SP piercing the stacked structure body ML along the Z-axis direction are provided. The semiconductor pillar SP is formed by, for example, burying a semiconductor in a through hole TH piercing the stacked structure body ML along the Z-axis direction. The semiconductor pillar SP is provided in plural.

The semiconductor pillar SP may have a columnar shape extending in the Z-axis direction, or a cylinder shape extending in the Z-axis direction. In the case where the semiconductor pillar SP has a cylinder shape extending in the Z-axis direction, an insulating film, for example, is buried in the cylinder.

The shape of the cross section when the semiconductor pillar SP is cut along a plane perpendicular to the Z-axis direction may be a circle, a flat circle, or any polygon. Hereinbelow, for easier description, the case is described where the shape of the cross section when the semiconductor pillar SP is cut along a plane perpendicular to the Z-axis direction is a substantially circular shape.

The plurality of semiconductor pillars SP are referred to as, for example, a first to a fourth semiconductor pillar SP1 to SP4. As illustrated in FIG. 3, two semiconductor pillars SP are electrically connected by a semiconductor connection portion CP (a first semiconductor connection portion CP1 and a second semiconductor connection portion CP2) on the semiconductor substrate 11 side. The first and second semiconductor pillars SP1 and SP2 connected by the first semiconductor connection portion CP1 constitute a pair to form one U-shaped NAND string. The third and fourth semiconductor pillars SP3 and SP4 connected by the second semiconductor connection portion CP2 constitute a pair to form another U-shaped NAND string. The nonvolatile semiconductor memory device 110 is a three-dimensionally stacked flash memory.

The direction in which the first semiconductor pillar SP1 and the second semiconductor pillar SP2 connected to each other by the semiconductor connection portion CP are aligned is set to the Y-axis direction.

An example of the specific configuration of the matrix memory cell unit MU1 will now be described.

FIG. 4 illustrates the configuration of the matrix memory cell unit MU1, and is, for example, a cross-sectional view corresponding to a part of the cross section along line B-B' of FIG. 3.

As illustrated in FIG. 4, the nonvolatile semiconductor memory device 110 includes a first stacked structure body ML1 and a second stacked structure body ML2.

The first stacked structure body ML1 includes a plurality of first electrode films 61*a* and a plurality of first inter-electrode insulating films 62*a* alternately stacked in the Z-axis direction.

The second stacked structure body ML2 is aligned with the first stacked structure body ML1 in a direction perpendicular to the Z-axis direction. The second stacked structure body ML2 includes a plurality of second electrode films 61*b* and a plurality of second inter-electrode insulating films 62*b* alternately stacked in the Z-axis direction.

Each of the plurality of first electrode films 61*a* and each of the plurality of second electrode films 61*b* are the same layer. For example, the distance between the semiconductor substrate 11 and each of the plurality of first electrode films 61*a* is equal to the distance between the semiconductor substrate 11 and each of the plurality of second electrode films 61*b*. The distance between the semiconductor substrate 11 and each of the plurality of first inter-electrode insulating films 62*a* is equal to the distance between the semiconductor substrate 11 and each of the plurality of second inter-electrode insulating films 62*b*.

The nonvolatile semiconductor memory device 110 further includes the first semiconductor pillar SP1, the second semiconductor pillar SP2, a first memory unit 47*a*, and a second memory unit 47*b*.

The first semiconductor pillar SP1 pierces the first stacked structure body ML1 along the Z-axis direction. The second semiconductor pillar SP2 pierces the second stacked structure body ML2 along the Z-axis direction. The second semiconductor pillar SP2 is aligned with the first semiconductor pillar SP1 along a second direction (the Y-axis direction) perpendicular to the first direction (the Z-axis direction).

The first memory unit 47*a* is provided between the plurality of first electrode films 61*a* and the first semiconductor pillar SP1. The second memory unit 47*b* is provided between the plurality of second electrode films 61*b* and the second semiconductor pillar SP2.

The first memory unit 47*a* includes, for example, a first pillar portion memory layer 48*pa* provided between the plurality of first electrode films 61*a* and the first semiconductor pillar SP1, a first pillar portion outer insulating film 43*pa* provided between the first pillar portion memory layer 48*pa* and the plurality of first electrode films 61*a*, and a first pillar portion inner insulating film 42*pa* provided between the first pillar portion memory layer 48*pa* and the first semiconductor pillar SP1.

The second memory unit 47*b* includes, for example, a second pillar portion memory layer 48*pb* provided between the plurality of second electrode films 61*b* and the second semiconductor pillar SP2, a second pillar portion outer insulating film 43*pb* provided between the second pillar portion memory layer 48*pb* and the plurality of second electrode films 61*b*, and a second pillar portion inner insulating film 42*pb* provided between the second pillar portion memory layer 48*pb* and the second semiconductor pillar SP2.

The nonvolatile semiconductor memory device 110 further includes the semiconductor connection portion CP that connects one end of the first semiconductor pillar SP1 and one end of the second semiconductor pillar SP2, a connection portion conductive layer BG (back gate) opposed to the semiconductor connection portion CP, and a connection portion insulating film 47*c* provided between the semiconductor connection portion CP and the connection portion conductive layer BG. A material that forms the first semiconductor pillar SP1 and the second semiconductor pillar SP2, for example, is used for the semiconductor connection portion CP.

The connection portion insulating film 47*c* includes, for example, a connection portion memory layer 48*c* provided between the semiconductor connection portion CP and the connection portion conductive layer BG, a connection portion outer insulating film 43*c* provided between the connection portion memory layer 48*c* and the connection portion conductive layer BG, and a connection portion inner insulating film 42*c* provided between the connection portion memory layer 48*c* and the semiconductor connection portion CP.

The memory layer 48 includes the first pillar portion memory layer 48*pa*, the second pillar portion memory layer 48*pb*, and the connection portion memory layer 48*c*. The memory layer 48 stores or discharges a charge by, for example, an electric field applied between the semiconductor pillar SP and the electrode film 61 to function as a portion that stores information. The memory layer 48 may be either a single layer film or a stacked film.

The inner insulating film 42 includes the first pillar portion inner insulating film 42*pa*, the second pillar portion inner insulating film 42*pb*, and the connection portion inner insulating film 42*c*. The inner insulating film 42 functions as, for example, a tunnelling insulating film.

The outer insulating film 43 includes the first pillar portion outer insulating film 43*pa*, the second pillar portion outer insulating film 43*pb*, and the connection portion outer insulating film 43*c*. The outer insulating film 43 functions as, for example, a block insulating film.

A stacked film including the outer insulating film 43, the memory layer 48, and the inner insulating film 42 is referred to as a stacked insulating film 47.

A portion of the stacked insulating film 47 forms the first memory unit 47*a*, another portion of the stacked insulating film 47 forms the second memory unit 47*b*, and still another portion of the stacked insulating film 47 forms the connection portion insulating film 47*c*.

Silicon oxide, for example, may be used for the inter-electrode insulating film 62, the inner insulating film 42, and the outer insulating film 43. Silicon nitride, for example, may be used for the memory layer 48.

An arbitrary material may be used for the inter-electrode insulating film 62, the inner insulating film 42, the outer insulating film 43, and the memory layer 48, not limited to the material illustrated above.

A prescribed electric signal is applied to the electrode film 61. The electrode film 61 functions as, for example, a word electrode of the nonvolatile semiconductor memory device 110.

The connection portion conductive layer BG is set at, for example, a prescribed electric potential. Thereby, the electrical connection between the first semiconductor pillar SP1 and the second semiconductor pillar SP2 by the semiconductor connection portion CP, for example, is controlled.

Any conductive material may be used for the electrode film 61 and the connection portion conductive layer BG. For example, amorphous silicon (noncrystalline silicon) provided with electrical conductivity by introducing an impurity, polysilicon (polycrystalline silicon) provided with electrical conductivity by introducing an impurity, or the like may be used, and also a metal, an alloy, or the like may be used.

In the nonvolatile semiconductor memory device 110, a memory cell transistor including the memory layer 48 is formed at the intersection of the electrode film 61 and the semiconductor pillar SP. The memory cell transistors are arranged in a three-dimensional matrix form, and each memory cell transistor functions as a memory cell MC that stores data by storing a charge in the memory layer 48.

As illustrated in FIG. 3, the nonvolatile semiconductor memory device 110 further includes select gate electrodes SG.

The select gate electrode SG is stacked with the stacked structure body ML along the Z-axis direction. In this specific example, the select gate electrode SG includes a strip-shaped portion extending along the X-axis direction. The semiconductor pillar SP further pierces the select gate electrode SG as well as the stacked structure body ML along the Z-axis direction. A select gate insulating film (not illustrated in FIG. 3) is provided between the select gate electrode SG and the semiconductor pillar SP.

A continuously formed semiconductor layer may be used for a portion piercing the stacked structure body ML and a portion piercing the select gate electrode SG of the semiconductor pillar SP. Alternatively, a portion of the semiconductor pillar SP piercing the stacked structure body ML and a portion of the semiconductor pillar SP piercing the select gate electrode SG may be formed in different processes and be electrically connected.

Thus, the nonvolatile semiconductor memory device 110 further includes a first select gate electrode SG1 stacked with the first stacked structure body ML1 along the Z-axis direction and pierced by the first semiconductor pillar SP1 and a second select gate electrode SG2 stacked with the second stacked structure body ML2 along the Z-axis direction and pierced by the second semiconductor pillar SP2.

The first select gate electrode SG1 and the second select gate electrode SG2 extend along a direction perpendicular to the Z-axis direction. The first select gate electrode SG1 and the second select gate electrode SG2 extend, for example, along the X-axis direction that is a direction parallel to the direction in which the first electrode film 61*a* and the second electrode film 61*b* extend.

A first select gate transistor SGT1 is formed at the intersection of the first select gate electrode SG1 and the first semiconductor pillar SP1, and a second select gate transistor SGT2 is formed at the intersection of the second select gate electrode SG2 and the second semiconductor pillar SP2. These select gate transistors function to select the semiconductor pillar SP.

As illustrated in FIG. 3, the nonvolatile semiconductor memory device 110 further includes, for example, a bit line BL (e.g. first interconnection) and a source line SL (e.g. second interconnection). The bit line BL is connected to another end of the first semiconductor pillar SP1 on the side opposite to the first semiconductor connection portion CP1. The source line SL is connected to another end of the second semiconductor pillar SP2 on the side opposite to the first semiconductor connection portion CP1. The source line SL extends in a direction orthogonal to the direction in which the bit line BL extends, for example. In this specific example, the bit line BL extends along the Y-axis direction and the source line SL extends along the X-axis direction.

The bit line BL is further connected to another end of the fourth semiconductor pillar SP4 on the side opposite to the second semiconductor connection portion CP2. The source line SL is further connected to another end of the third semiconductor pillar SP3 on the side opposite to the second semiconductor connection portion CP2. The third semiconductor pillar SP3 is aligned with the second semiconductor pillar SP2 on the opposite side of the second semiconductor pillar SP2 from the first semiconductor pillar SP1 along the Y-axis direction. The fourth semiconductor pillar SP4 is aligned with the third semiconductor pillar SP3 on the opposite side of the third semiconductor pillar SP3 from the second semiconductor pillar SP2 along the Y-axis direction. The first semiconductor pillar SP1 is connected to the bit line BL by a via V1, and the fourth semiconductor pillar SP4 is connected to the bit line BL by a via V2.

The first select gate electrode SG1 is disposed between the bit line BL and the first stacked structure body ML1. The second select gate electrode SG2 is disposed between the source line SL and the second stacked structure body ML2. The fourth select gate electrode SG4 is disposed between the bit line BL and the fourth stacked structure body. The third select gate electrode SG3 is disposed between the source line SL and the third stacked structure body.

By the configuration mentioned above, desired data can be written on or read out from an arbitrary memory cell MC of an arbitrary semiconductor pillar SP.

As illustrated in FIG. 1, in the nonvolatile semiconductor memory device 110, the semiconductor connection portion CP includes an end connection portion CPE, a first protrusion CPP1, and a second protrusion CCP2.

As described later, there is also a case where, for example, the first protrusion CPP1 is provided and the second protrusion CPP2 is not provided.

The end connection portion CPE has a connection portion side face CPEs along the Y-axis direction. One end of the first semiconductor pillar SP1 is connected to the end connection portion CPE at the upper face CPEu of the end connection portion CPE. One end of the second semiconductor pillar SP2 is connected to the end connection portion CPE at the upper face CPEu of the end connection portion CPE. The end connection portion CPE extends along the Y-axis direction.

The first protrusion CPP1 is provided at the connection portion side face CPEs. The first protrusion CPP1 protrudes at the connection portion side face CPEs in a direction intersecting with the Z-axis direction. The first protrusion CPP1 has a side face continuous with a side face of the first semiconductor pillar SP1 along the Z-axis direction.

The second protrusion CPP2 is provided at the connection portion side face CPEs. The second protrusion CPP2 protrudes at the connection portion side face CPEs in a direction intersecting with the Z-axis direction. The second protrusion CPP2 has a side face continuous with a side face of the second semiconductor pillar SP2 along the Z-axis direction.

The semiconductor connection portion CP does not include a portion smaller than the diameter of the first semiconductor pillar SP1 and the diameter of the second semiconductor pillar SP2. Furthermore, the semiconductor connection portion CP may not include a portion smaller than the width along the X-axis direction of the end connection portion CPE.

This can provide a nonvolatile semiconductor memory device of a configuration of collectively processed three-dimensionally stacked memory that can expand the allowable margin of mask alignment accuracy and dimensional accuracy to increase productivity.

The configuration of the semiconductor connection portion CP will now be described in detail.

As illustrated in FIG. 1, the central axis of the semiconductor pillar SP and the central axis of the semiconductor connection portion CP are out of alignment each other. This results from, for example, mask misalignment and the like caused in the process of forming the end connection portion CPE of the semiconductor connection portion CP and the process of forming the semiconductor pillar SP.

That is, as illustrated in FIG. 1, the position in the X-axis direction of the center CPEc in the X-axis direction of the end connection portion CPE shifts from the position in the X-axis direction of the center SPc in the X-axis direction of the first semiconductor pillar SP1 (and the center in the X-axis direction of the second semiconductor pillar SP2) along the X-axis direction.

The shift amount xcs that is the distance along the X-axis direction between the center CPEc and the center SPc corresponds to, for example, the amount of the mask misalignment and the dimensional variation in the process of forming the end connection portion CPE and the process of forming the semiconductor pillar SP.

The first protrusion CPP1 and the second protrusion CPP2 are formed by, for example, holes deeper than the heights of the first semiconductor pillar SP1 and the second semiconductor pillar SP2 being formed in positions shifted from the center of the end connection portion CPE during the formation of the first semiconductor pillar SP1 and the second semiconductor pillar SP2.

As described later, the semiconductor connection portion CP is formed by, for example, burying a semiconductor material in the space of a trench for the semiconductor connection portion CP via through holes for forming the first semiconductor pillar SP1 and the second semiconductor pillar SP2.

In a comparative example in which holes deeper than the heights of the first semiconductor pillar SP1 and the second semiconductor pillar SP2 are not formed and the first protrusion CPP1 and the second protrusion CPP2 are not provided, if the shift amount xcs corresponding to the amount of the mask misalignment and the dimensional variation is large, the opening width of the connection portion between the through hole and the trench is small, and this makes it difficult to bury a semiconductor material in the trench via the through hole. Therefore, productivity may be reduced.

In contrast, in the nonvolatile semiconductor memory device 110 according to this embodiment, holes deeper than the heights of the first semiconductor pillar SP1 and the second semiconductor pillar SP2 are formed, and thereby the opening width of the connection portion between the through hole and the trench can be made sufficiently large even when the shift amount xcs corresponding to the amount of the mask misalignment and the dimensional variation is large.

In regard to an example of the method for manufacturing the nonvolatile semiconductor memory device 110, an example of the case where there are mask misalignment and dimensional variation will now be described.

Figure 5:
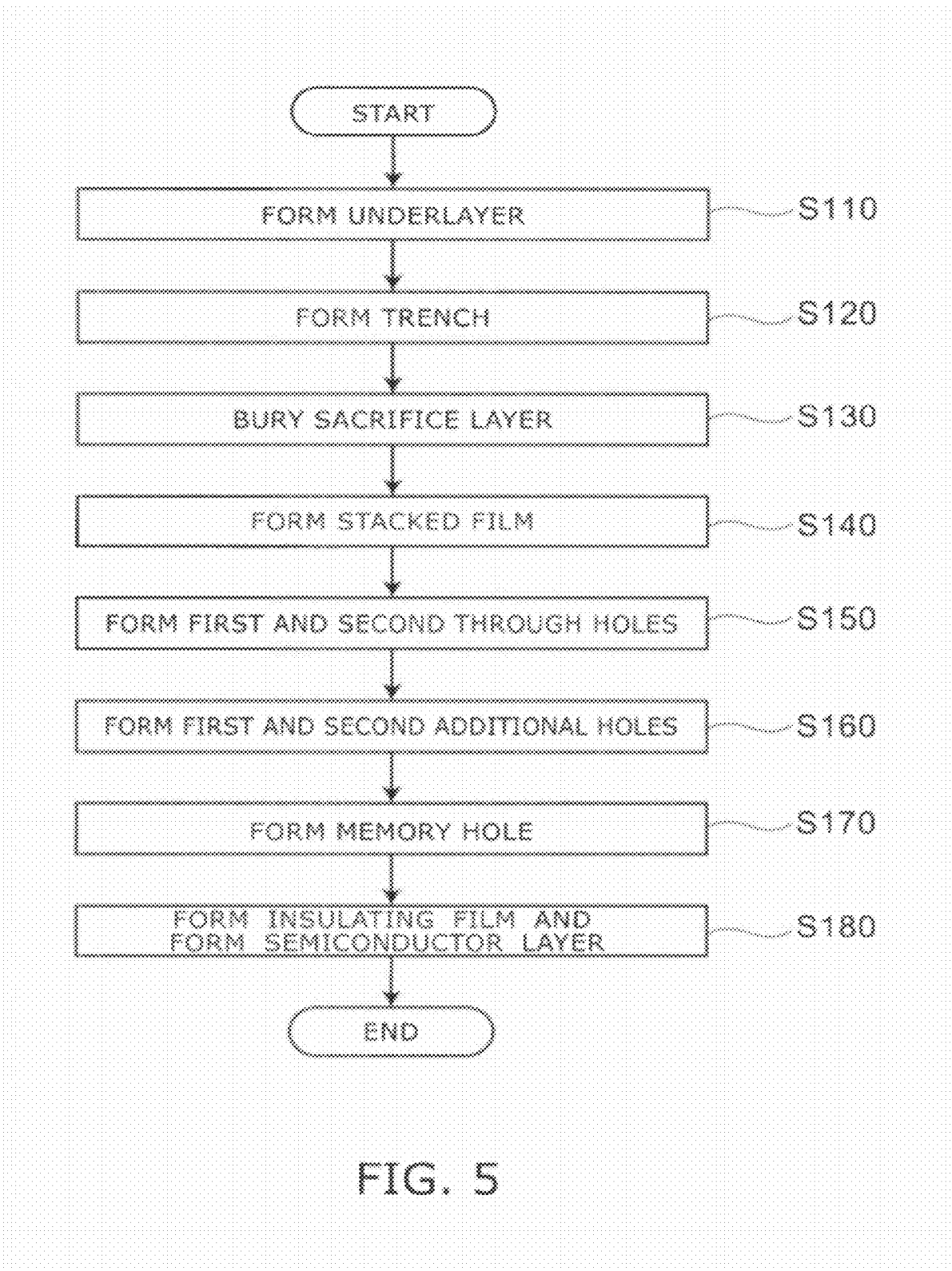
FIG. 5 is a flow chart illustrating a method for manufacturing the nonvolatile semiconductor memory device according to the first embodiment.

FIG. 5 is a flow chart illustrating a method for manufacturing the nonvolatile semiconductor memory device according to the first embodiment.

FIG. 6A, FIG. 6B, and FIG. 6C to FIG. 15A, FIG. 15B, and FIG. 15C are schematic cross-sectional views in order of the processes, illustrating the method for manufacturing the nonvolatile semiconductor memory device according to the first embodiment.

Figure 6A:
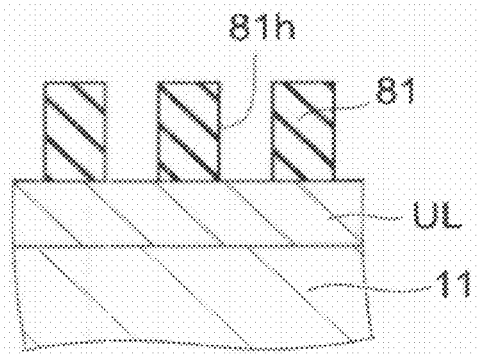
Figure 6B:
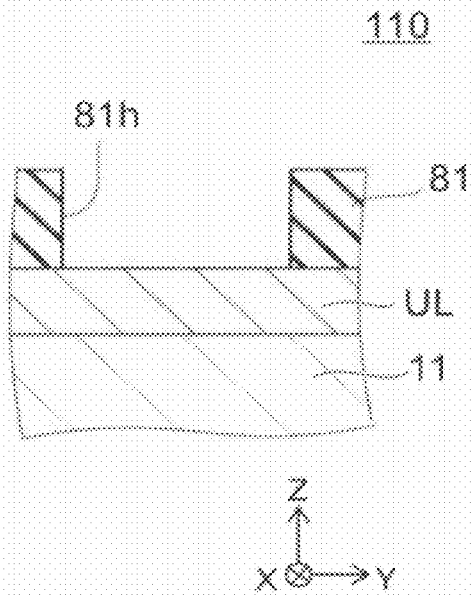
Figure 6C:
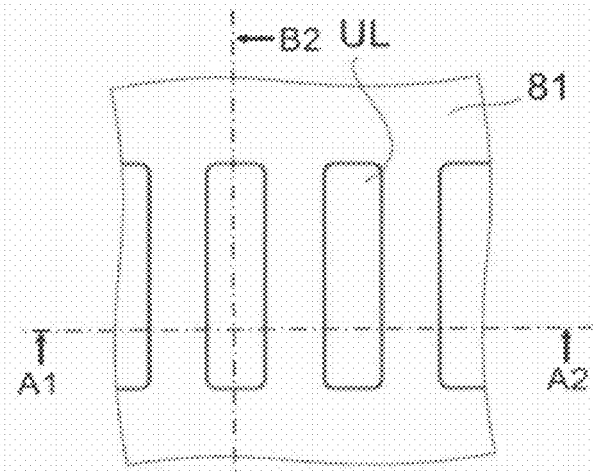

FIG. 6C is a plan view, FIG. 6A is a cross-sectional view taken along line A1-A2 of FIG. 6C, and FIG. 6B is a cross-sectional view taken along line B1-B2 of FIG. 6C. The cross section along line A1-A2 of FIG. 6C corresponds to the cross section along line A1-A2 of FIG. 1. Also FIG. 7A, FIG. 7B, and FIG. 7C to FIG. 15A, FIG. 15B, and FIG. 15C have similar correspondence relationships.

As illustrated in FIG. 6A, FIG. 6B, and FIG. 6C, an underlayer UL is formed on the semiconductor substrate 11. This process corresponds to step S110 illustrated in FIG. 5. The underlayer UL includes, for example, a layer that forms at least a part of the connection portion conductive layer BG. These drawings omit the interlayer insulating film 13. A resist layer 81 including openings 81h having shapes corresponding to the end connection portions CPE of the semiconductor connection portions CP is formed on the underlayer UL.

As illustrated in FIG. 7A, FIG. 7B, and FIG. 7C, the resist layer 81 is used as a mask to form trenches TR in regions of the underlayer UL in which the semiconductor connection portions CP are formed. This process corresponds to step S120 illustrated in FIG. 5. Dry etching, for example, is used for the formation of the trenches TR. Although the depth of the trench TR is equal to the thickness of the underlayer UL in this specific example, the depth of the trench TR may be shallower than the thickness of the underlayer UL.

Figure 8A:
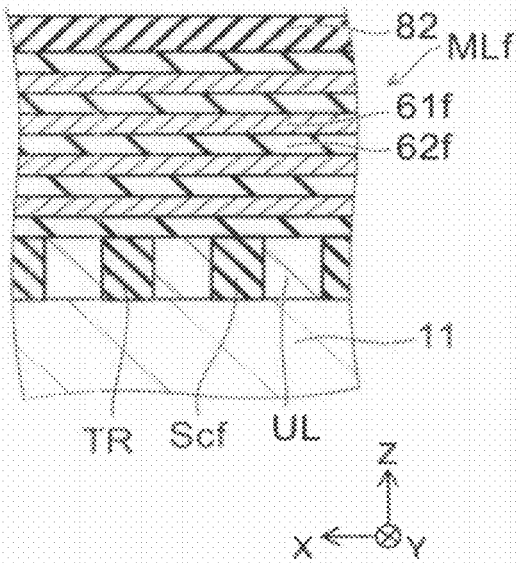
Figure 8B:
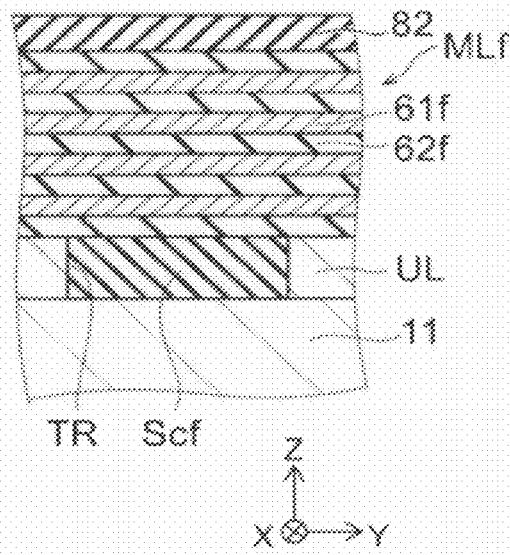
Figure 8C:
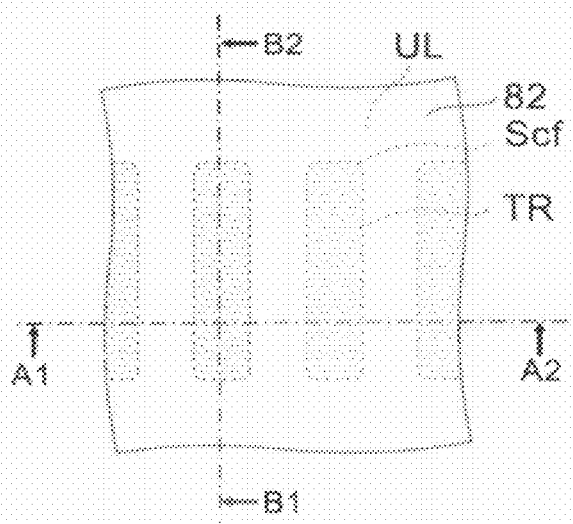

As illustrated in FIG. 8A, FIG. 8B, and FIG. 8C, a sacrifice layer SCf is buried in the trench TR. This process corresponds to step S130 illustrated in FIG. 5.

Then, a stacked film MLf that forms the first stacked structure body ML1 and the second stacked structure body ML2 is formed on the underlayer UL and the sacrifice layer SCf. This process corresponds to step S140 illustrated in FIG. 5.

The stacked film MLf includes conductive films 61f that form the first electrode films 61a and the second electrode films 61b and insulating films 62f that form the first inter-electrode insulating films 62a and the second inter-electrode insulating films 62b.

Then, a mask member 82 is formed on the stacked film MLf.

As illustrated in FIG. 9A, FIG. 9B, and FIG. 9C, a resist layer 83 including openings 83h having shapes corresponding to the first semiconductor pillar SP1 and the second semiconductor pillar SP2 is formed on the mask member 82.

Figure 10A:
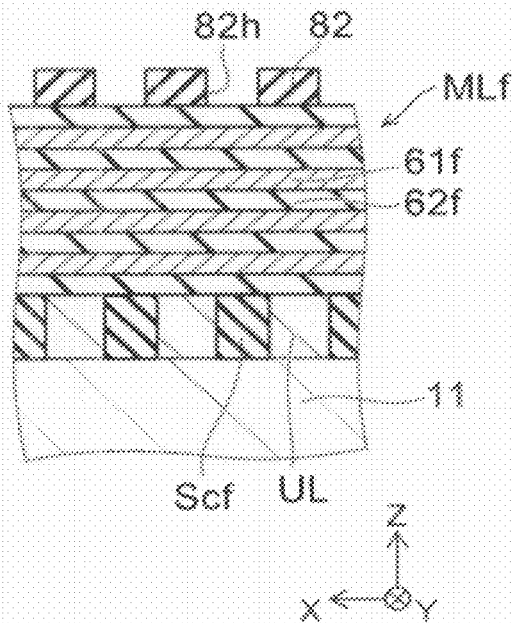
Figure 10B:
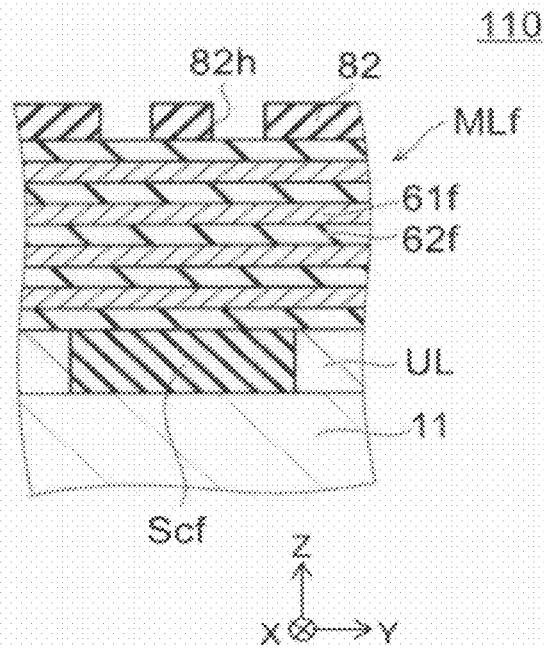
Figure 10C:
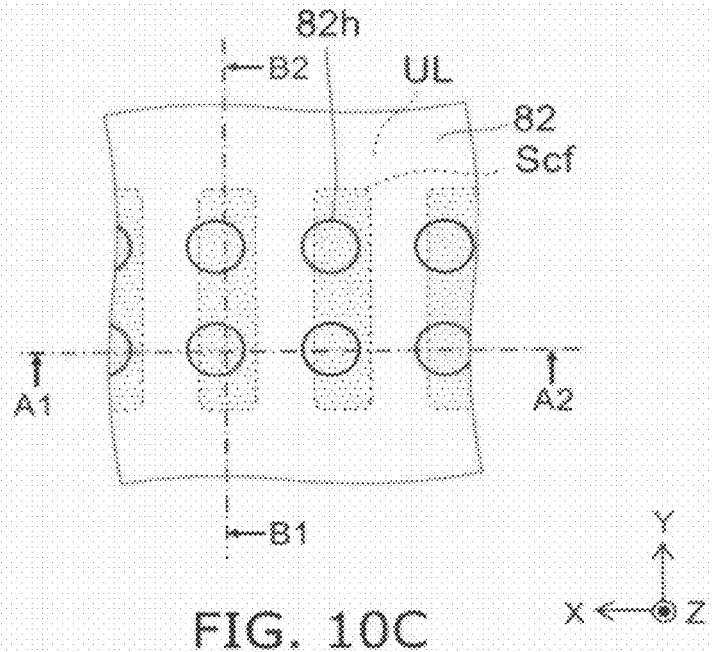

As illustrated in FIG. 10A, FIG. 10B, and FIG. 10C, the resist layer 83 is used as a mask to process the mask member 82 to form openings 82h in the mask member 82.

As illustrated in FIG. 11A, FIG. 11B, and FIG. 11C, the mask member 82 is used as a mask to form the through holes TH (a first through hole TH1 and a second through hole TH2) in the stacked film MLf. That is, the first through hole TH1 that pierces the stacked film MLf along the Z-axis direction in the position corresponding to the first semiconductor pillar SP1 and reaches the sacrifice layer SCf and the second through hole TH2 that pierces the stacked film MLf along the Z-axis direction in the position corresponding to the second semiconductor pillar SP2 and reaches the sacrifice layer SCf are formed. This process corresponds to step S150 illustrated in FIG. 5. Dry etching, for example, is used for the formation of the through holes TH.

Figure 12A:
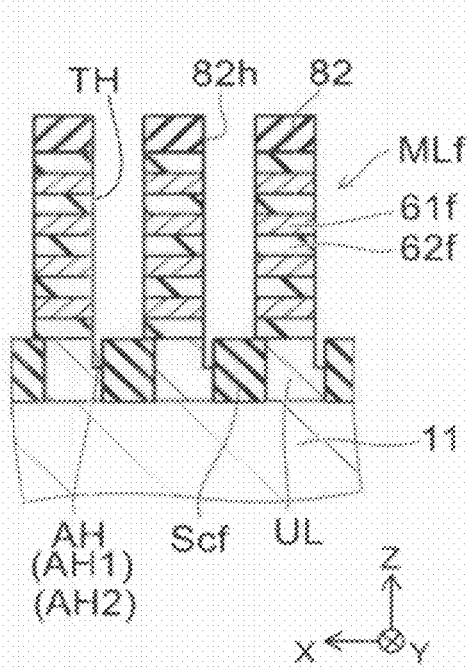
Figure 12B:
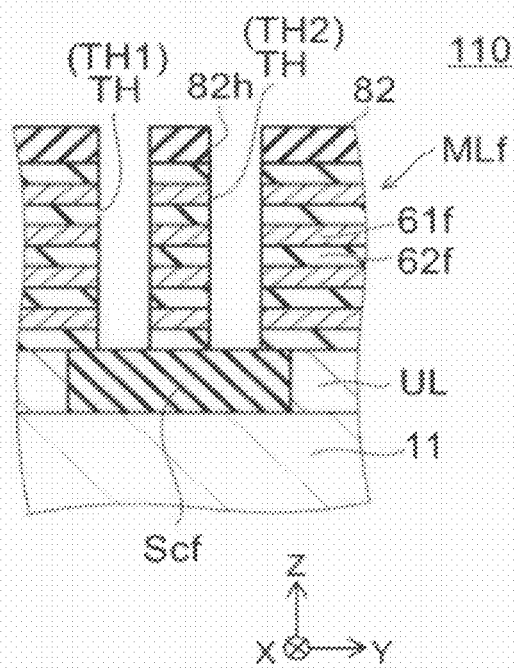
Figure 12C:
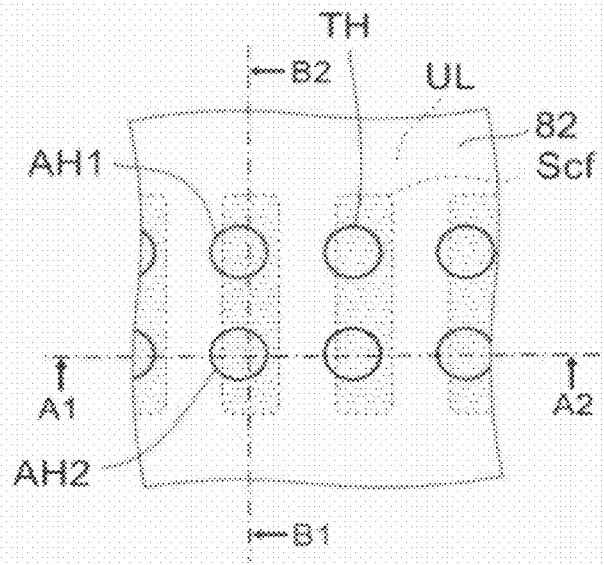

As illustrated in FIG. 12A, FIG. 12B, and FIG. 12C, the mask member 82 is used as a mask to dig the underlayer UL exposed from the through holes TH to form additional holes AH. That is, at least a part of the underlayer UL exposed from the first through hole TH1 is removed to form a first additional hole AH1 and at least a part of the underlayer UL exposed from the second through hole TH2 is removed to form a second additional hole AH2. This process corresponds to step S160 illustrated in FIG. 5. Dry etching, for example, is used for the formation of the additional holes AH.

The depth of the additional hole AH (the first additional hole AH1 and the second additional hole AH2) is described later.

Figures 13A, 13B:
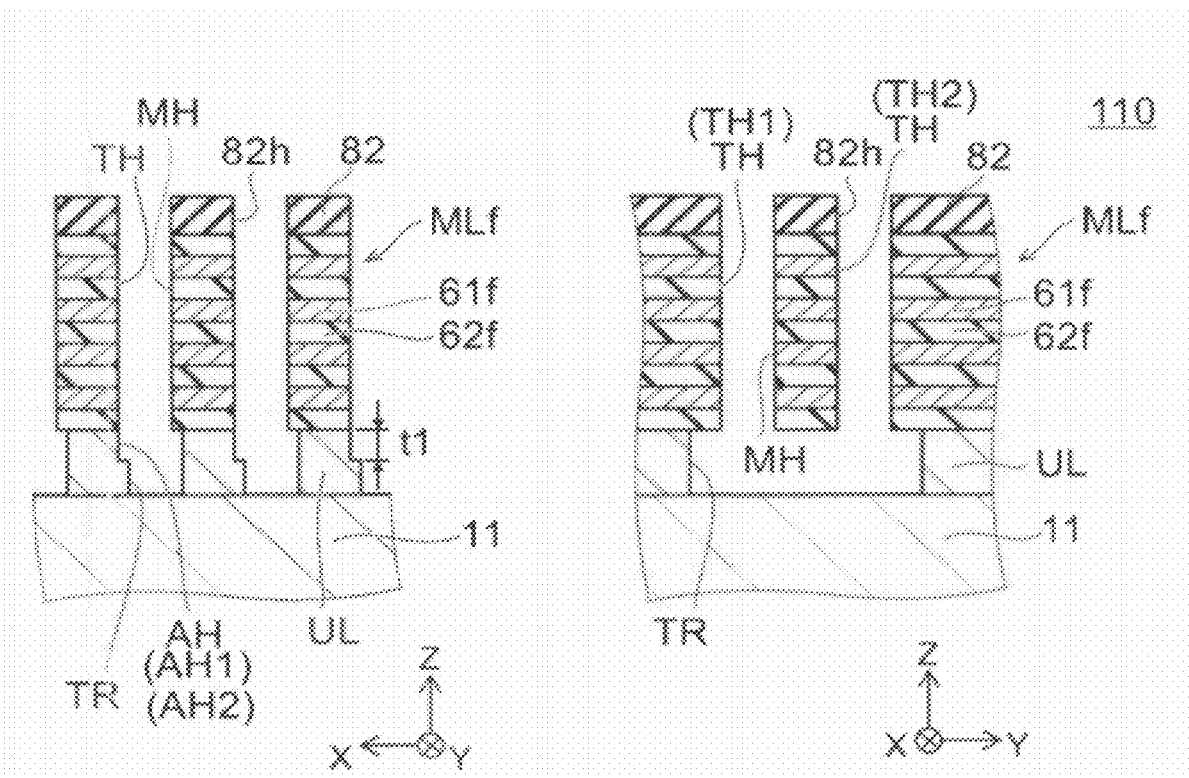
Figure 13C:
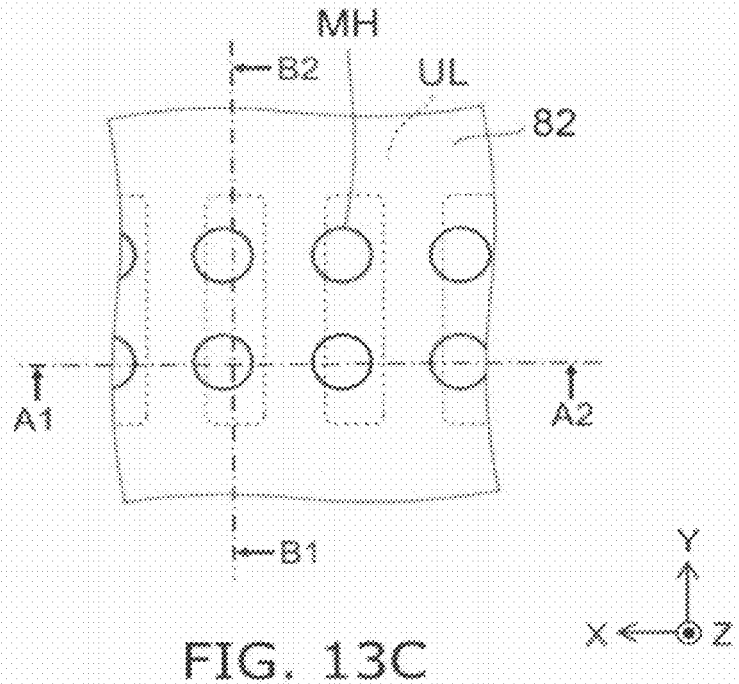

As illustrated in FIG. 13A, FIG. 13B, and FIG. 13C, the sacrifice layer SCf is removed via the first through hole TH1 and the second through hole TH2 to form a memory hole MH that includes the first through hole TH1, the second through hole TH2, the trench TR, the first additional hole AH1, and the second additional hole AH2. This process corresponds to step S170 illustrated in FIG. 5.

Figure 14A:
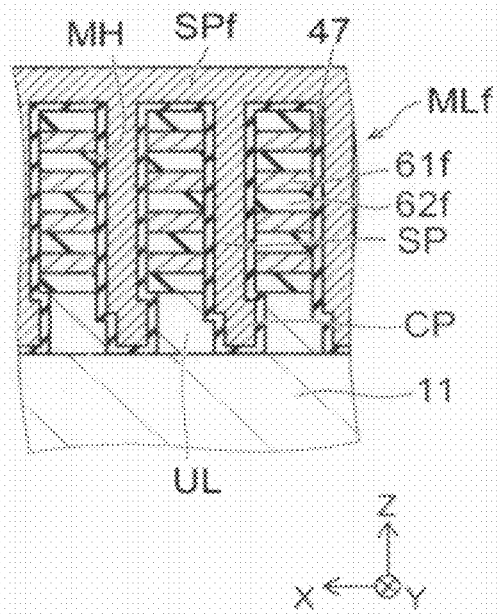
Figure 14B:
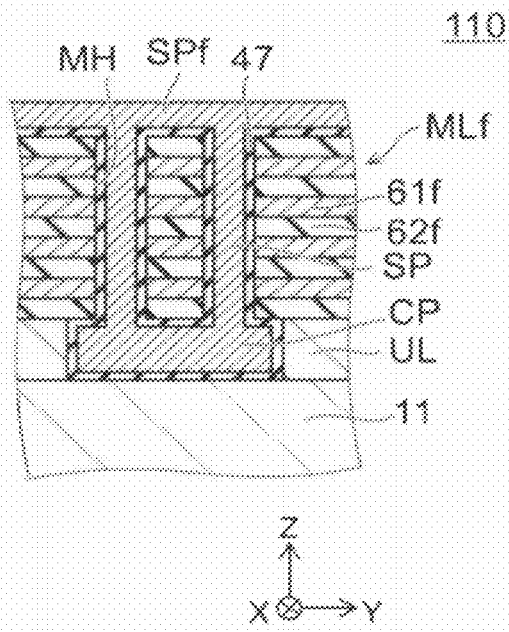
Figure 14C:
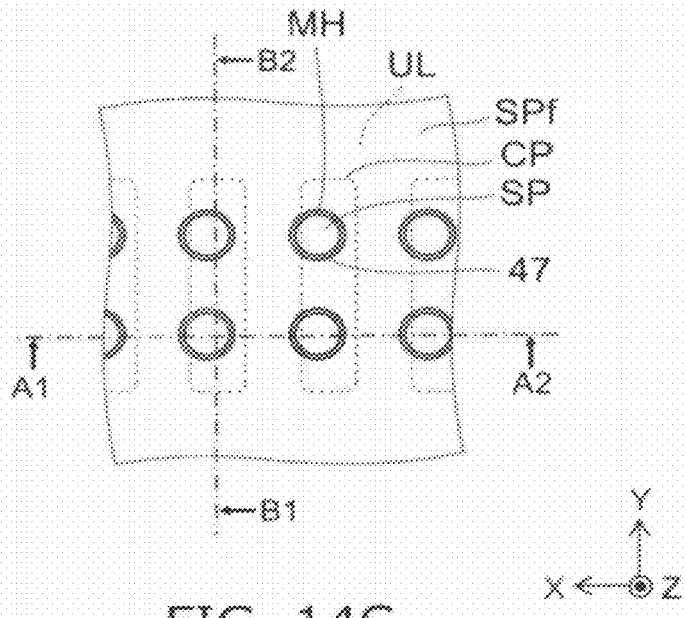

As illustrated in FIG. 14A, FIG. 14B, and FIG. 14C, an insulating film (the stacked insulating film 47) that forms the first memory unit 47a and the second memory unit 47b is formed on the wall face of the memory hole MH, and a semiconductor layer SPf that forms the first semiconductor pillar SP1, the second semiconductor pillar SP2, and the semiconductor connection portion CP is formed in the remaining space of the memory hole MH. This process corresponds to step S180 illustrated in FIG. 5.

Figure 15A:
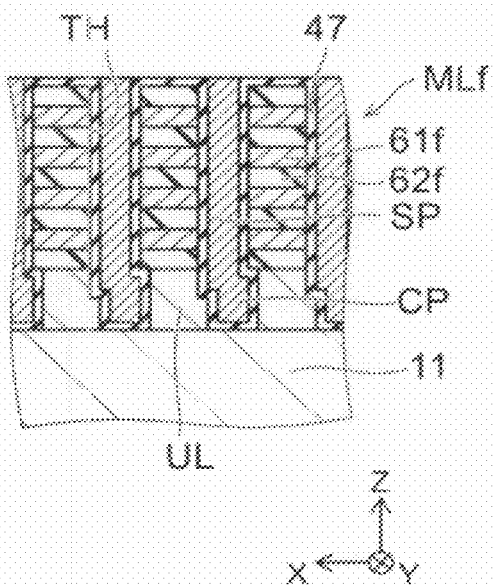
Figure 15B:
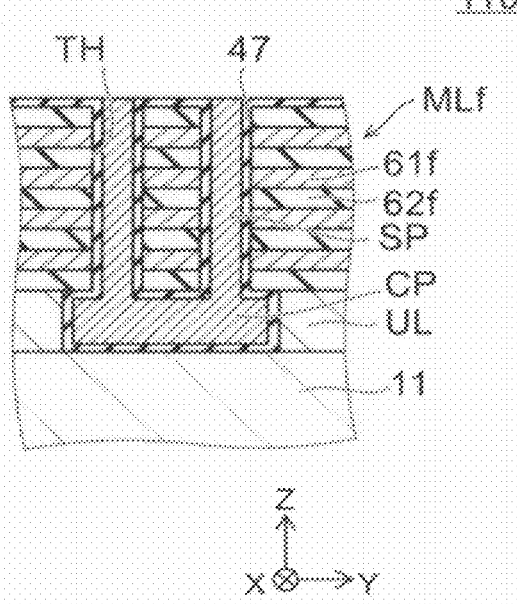
Figure 15C:
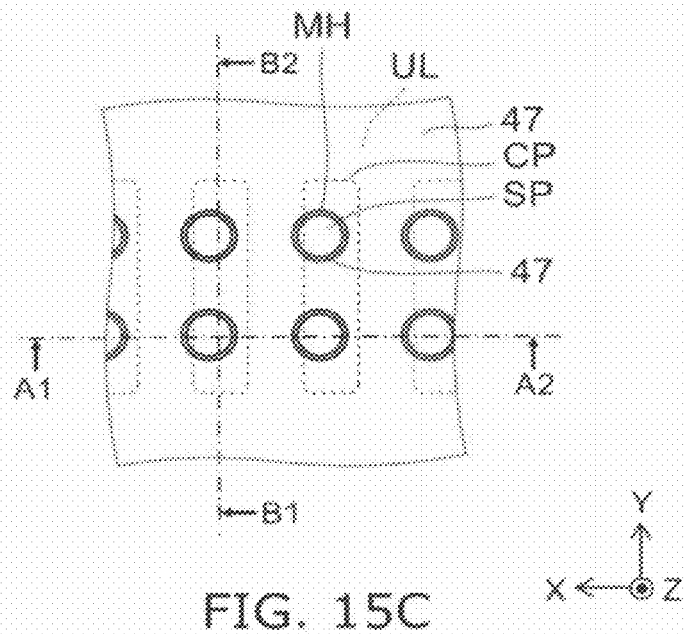

As illustrated in FIG. 15A, FIG. 15B, and FIG. 15C, the semiconductor layer SPf formed on the stacked film MLf is removed and the surface is planarized, as necessary.

After that, the formation of the select gate electrodes SG, the formation of various interconnections, the formation of contact electrodes for connection, and the like are performed, and the nonvolatile semiconductor memory device 110 is thus completed.

FIG. 16A, FIG. 16B, and FIG. 16C to FIG. 18A, FIG. 18B, and FIG. 18C are schematic cross-sectional views in order of the processes, illustrating a method for manufacturing a nonvolatile semiconductor memory device of a comparative example.

Figures 16A, 16B:
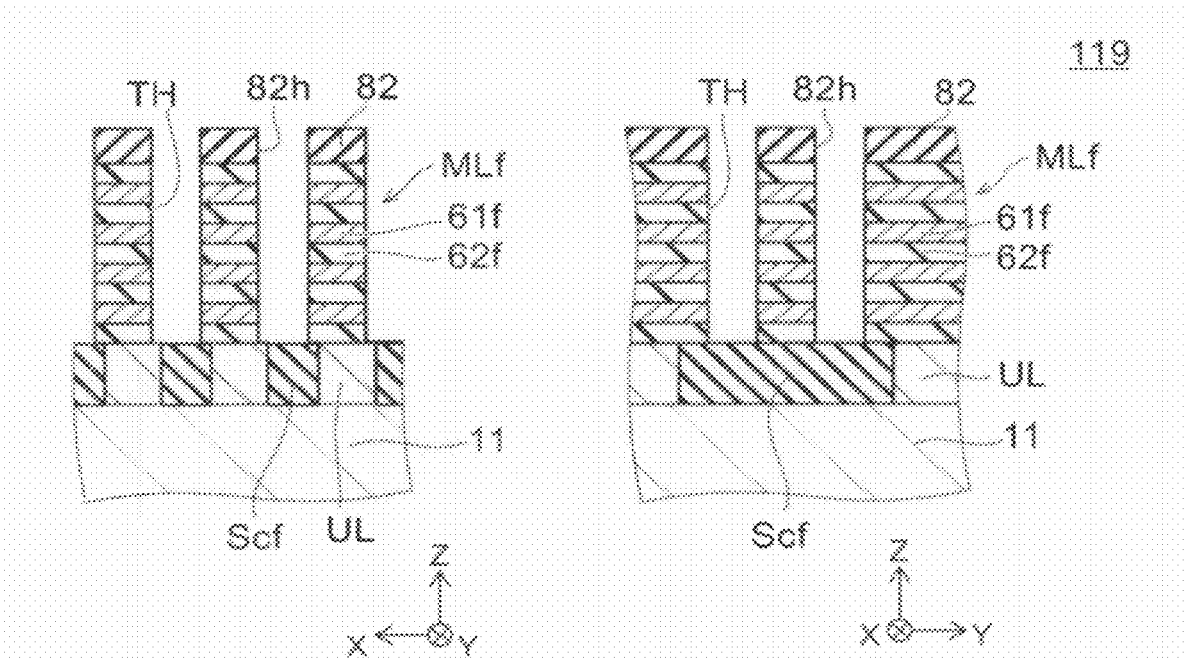
Figure 16C:
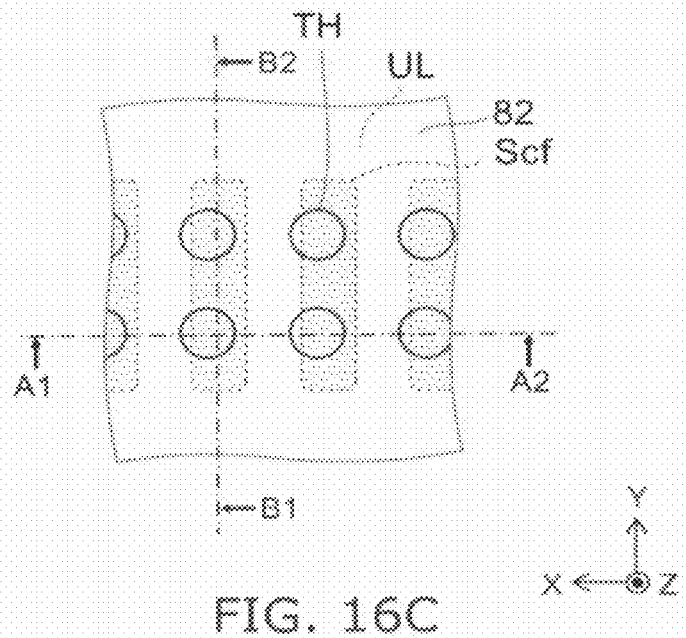

FIG. 16C is a plan view, FIG. 16A is a cross-sectional view taken along line A1-A2 of FIG. 16C, and FIG. 16B is a cross-sectional view taken along line B1-B2 of FIG. 16C. Also the other drawings have similar correspondence relationships.

In a nonvolatile semiconductor memory device 119 of the comparative example, although the processes of step S110 to step S150 illustrated in FIG. 5 are similar to the nonvolatile semiconductor memory device 110, step S160 is not performed in the nonvolatile semiconductor memory device 119.

That is, as illustrated in FIG. 16A, FIG. 16B, and FIG. 16C, as step S150, the first through hole TH1 that pierces the stacked film MLf along the Z-axis direction in the position corresponding to the first semiconductor pillar SP1 and reaches the sacrifice layer SCf and the second through hole TH2 that pierces the stacked film MLf along the Z-axis direction in the position corresponding to the second semiconductor pillar SP2 and reaches the sacrifice layer SCf are formed.

Figure 17A:
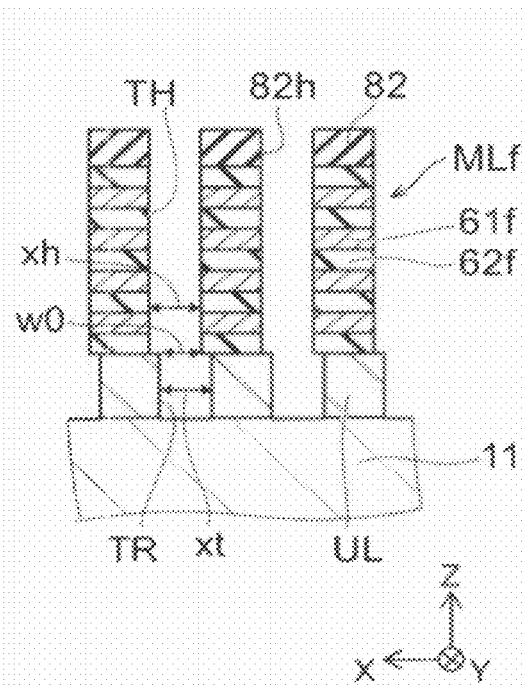
Figure 17B:
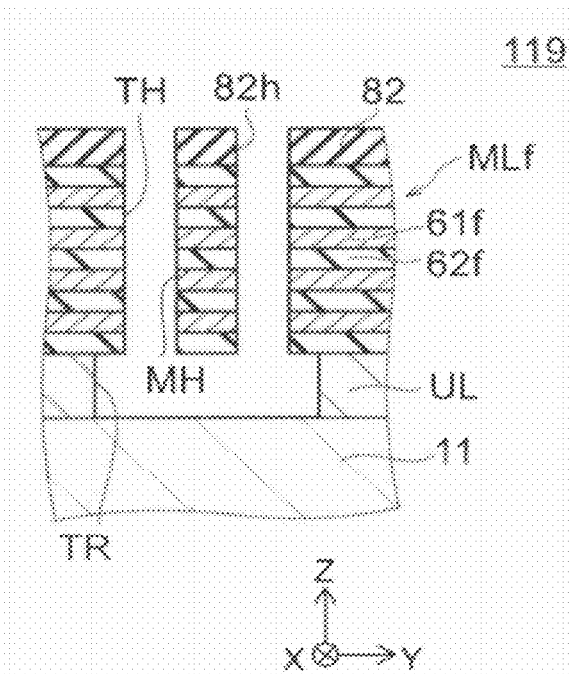
Figure 17C:
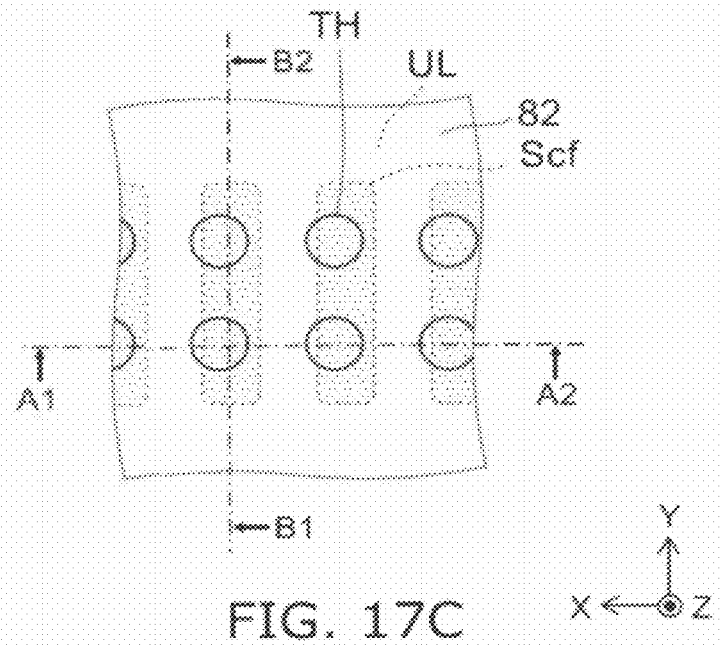

As illustrated in FIG. 17A, FIG. 17B, and FIG. 17C, the sacrifice layer SCf is removed via the first through hole TH1 and the second through hole TH2 to form the memory hole MH. That is, in the nonvolatile semiconductor memory device 119, step S160 is not performed and step S170 is performed.

The memory hole MH thus formed includes the first through hole TH1, the second through hole TH2, and the trench TR, but the first additional hole AH1 and the second additional hole AH2 are not provided in the memory hole MH. Therefore, the opening width w0 of the connection portion between the through hole TH and the trench TR is narrow.

The opening width w0 of the connection portion is, for example, a value smaller than the width (a through hole diameter xh) of the through hole TH by a width corresponding to the misalignment of the masks for the through hole TH and the trench TR.

Figure 18A:
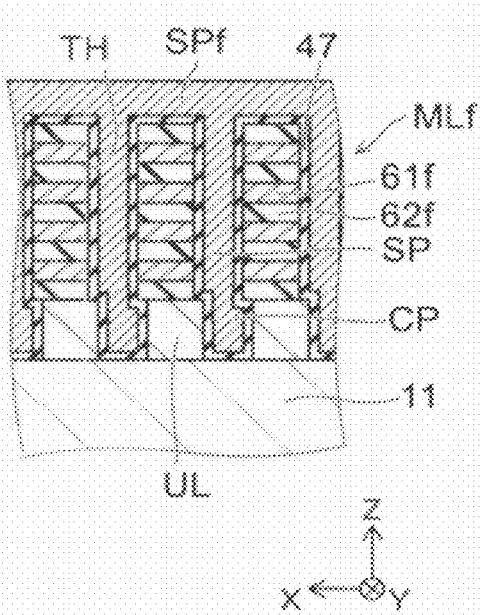
Figure 18B:
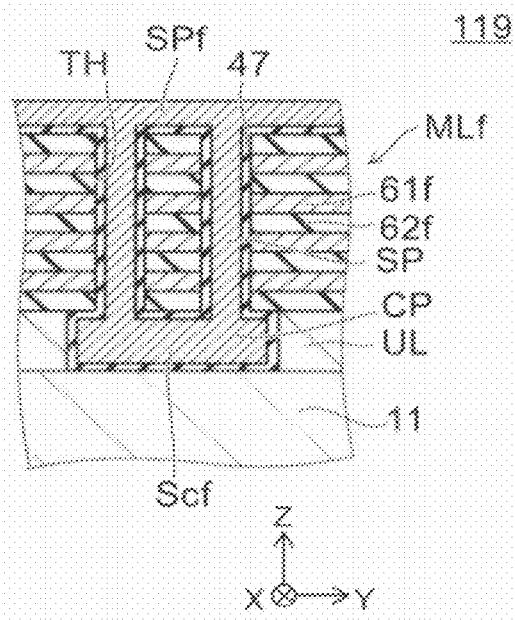
Figure 18C:
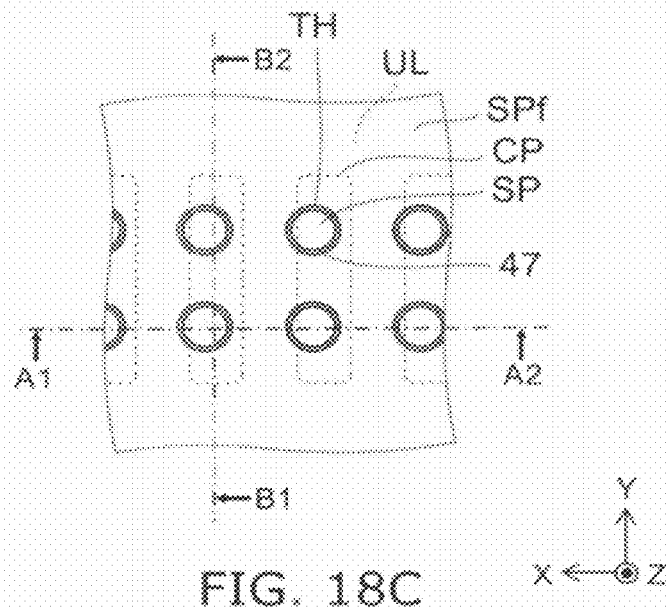

As illustrated in FIG. 18A, FIG. 18B, and FIG. 18C, an insulating film (the stacked insulating film 47) that forms the first pillar portion memory layer 48$pa$ and the second pillar portion memory layer 48$pb$ is formed on the wall face of the memory hole MH, and the semiconductor layer SPf that forms the first semiconductor pillar SP1, the second semiconductor pillar SP2, and the semiconductor connection portion CP is formed in the remaining space of the memory hole MH.

At this time, since the opening width w0 of the connection portion between the through hole TH and the trench TR is, for example, a value smaller than the through hole diameter xh by a width corresponding to the mask misalignment as mentioned above, it may be difficult to sufficiently fill the interior of the memory hole MH with the stacked insulating film 47 and the semiconductor layer SPf. Thereby, there is a possibility that, for example, the connection between the semiconductor pillar SP and the semiconductor connection portion CP is insufficient.

If the mask misalignment and the dimensional variation occur during the formation of the trench TR (step S120) and the formation of the through hole TH (step S150), the opening width w0 of the connection portion (coupling portion) between the through hole TH and the trench TR is small, and there is a possibility that, for example, the coupling portion is blocked by the stacked insulating film 47. In the case where the coupling portion is blocked, there is also a possibility that the filling of the semiconductor layer SPf is insufficient and the device does not function as a device.

Furthermore, for example, the cross section of the semiconductor layer SPf decreases and the effective resistance of the semiconductor layer SPf increases in the portion of the trench TR. Furthermore, the stacked insulating film 47 and the semiconductor layer SPf may be formed ununiformly to cause characteristic variation in the portion of the trench TR.

In the nonvolatile semiconductor memory device 110 and the method for manufacturing the same according to this embodiment, the additional hole AH is formed, and the opening width of the connection portion between the through hole TH and the trench TR is kept a sufficient magnitude so that the interior of the memory hole MH can be filled with the stacked insulating film 47 and the semiconductor layer SPf sufficiently and uniformly.

Figure 19:
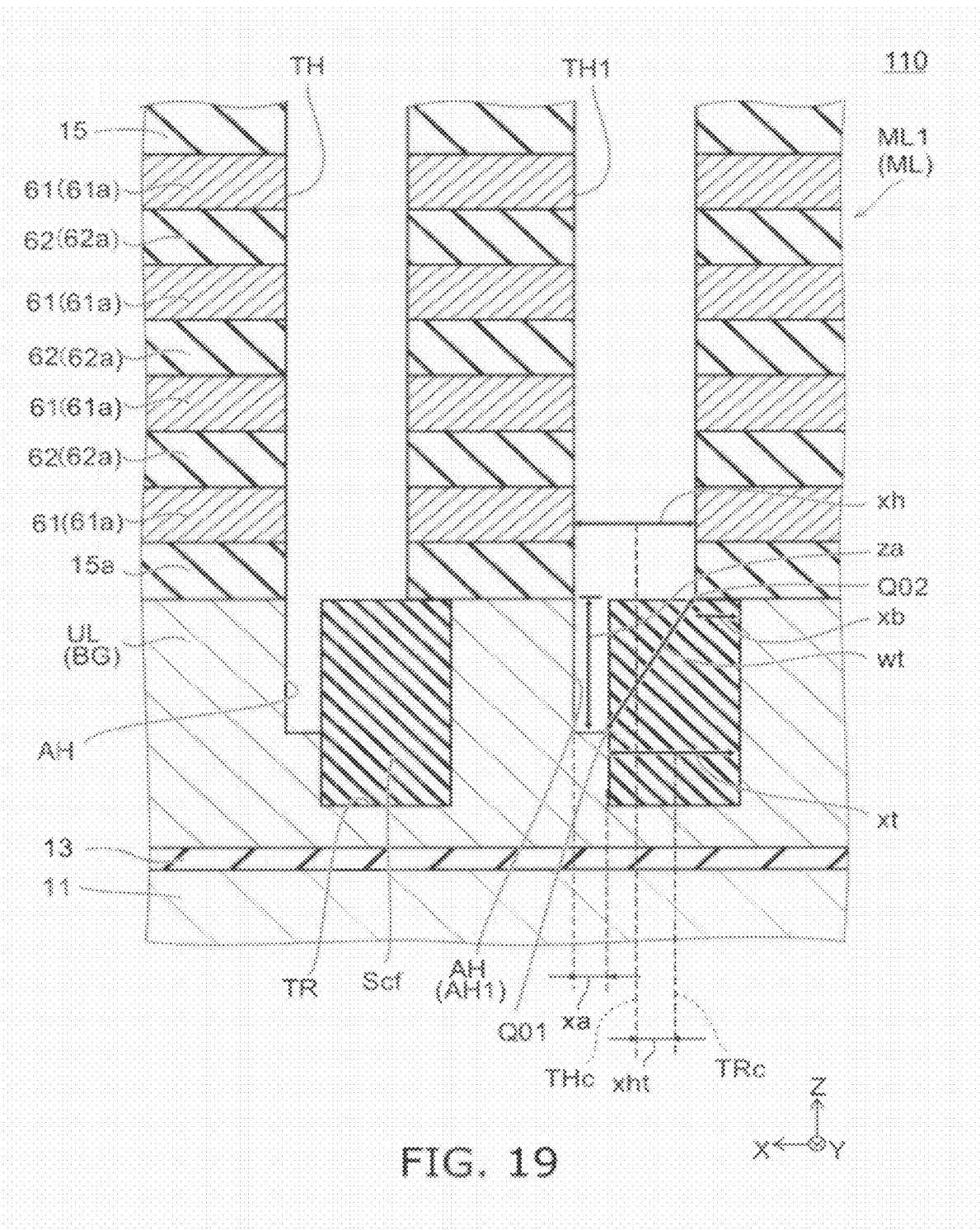
FIG. 19 is a schematic cross-sectional view illustrating a process of the method for manufacturing the nonvolatile semiconductor memory device according to the first embodiment.

FIG. 19 is a schematic cross-sectional view illustrating a process of the method for manufacturing the nonvolatile semiconductor memory device according to the first embodiment.

That is, the drawing illustrates a process that forms the additional hole AH, and is an enlarged schematic cross-sectional view of FIG. 12A.

Figure 20:
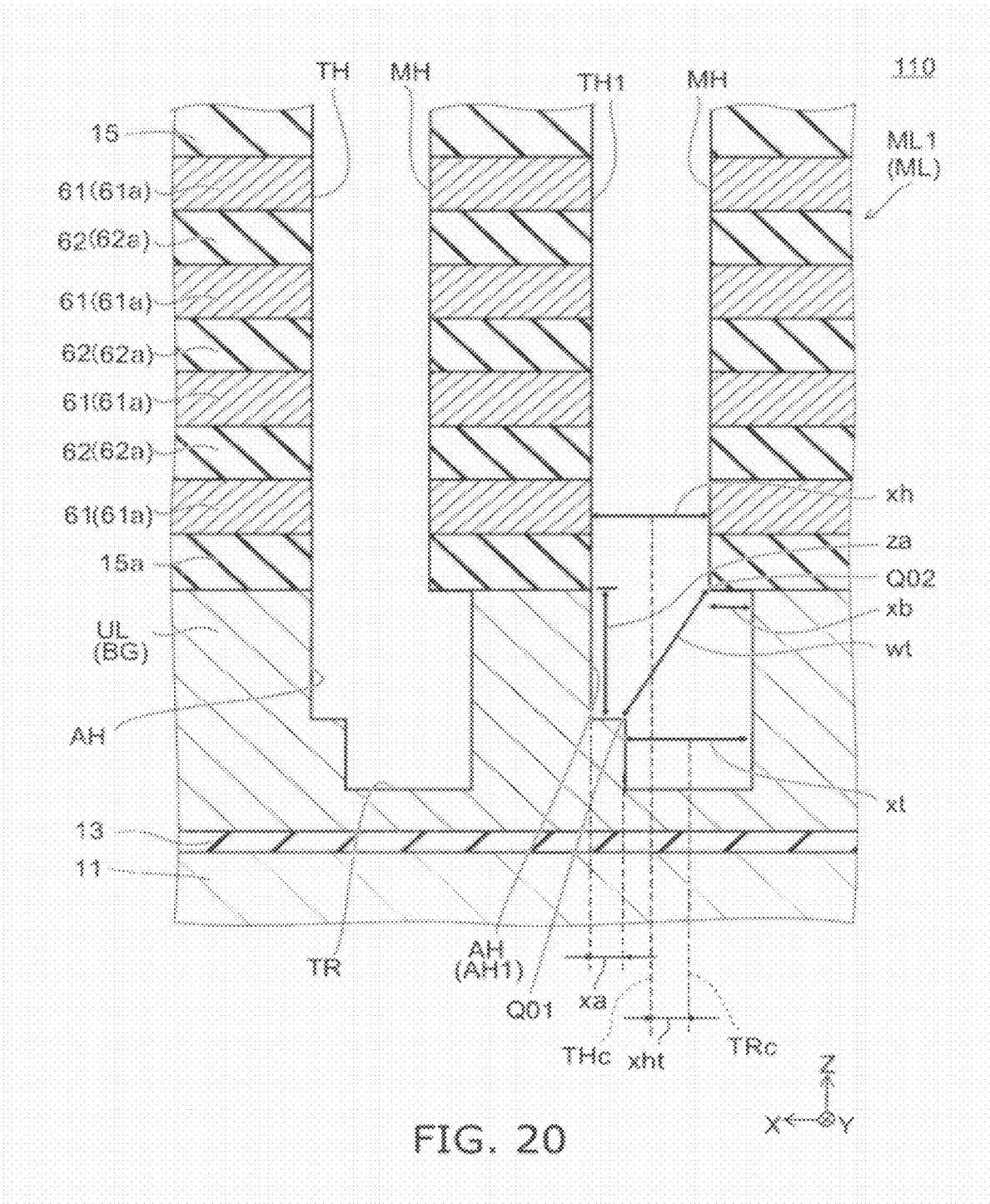
FIG. 20 is a schematic cross-sectional view illustrating a process of the method for manufacturing the nonvolatile semiconductor memory device according to the first embodiment.

FIG. 20 is a schematic cross-sectional view illustrating the process of the method for manufacturing the nonvolatile semiconductor memory device according to the first embodiment.

That is, the drawing illustrates a process that forms the memory hole MH, and is an enlarged schematic cross-sectional view of FIG. 13A.

Figure 21:
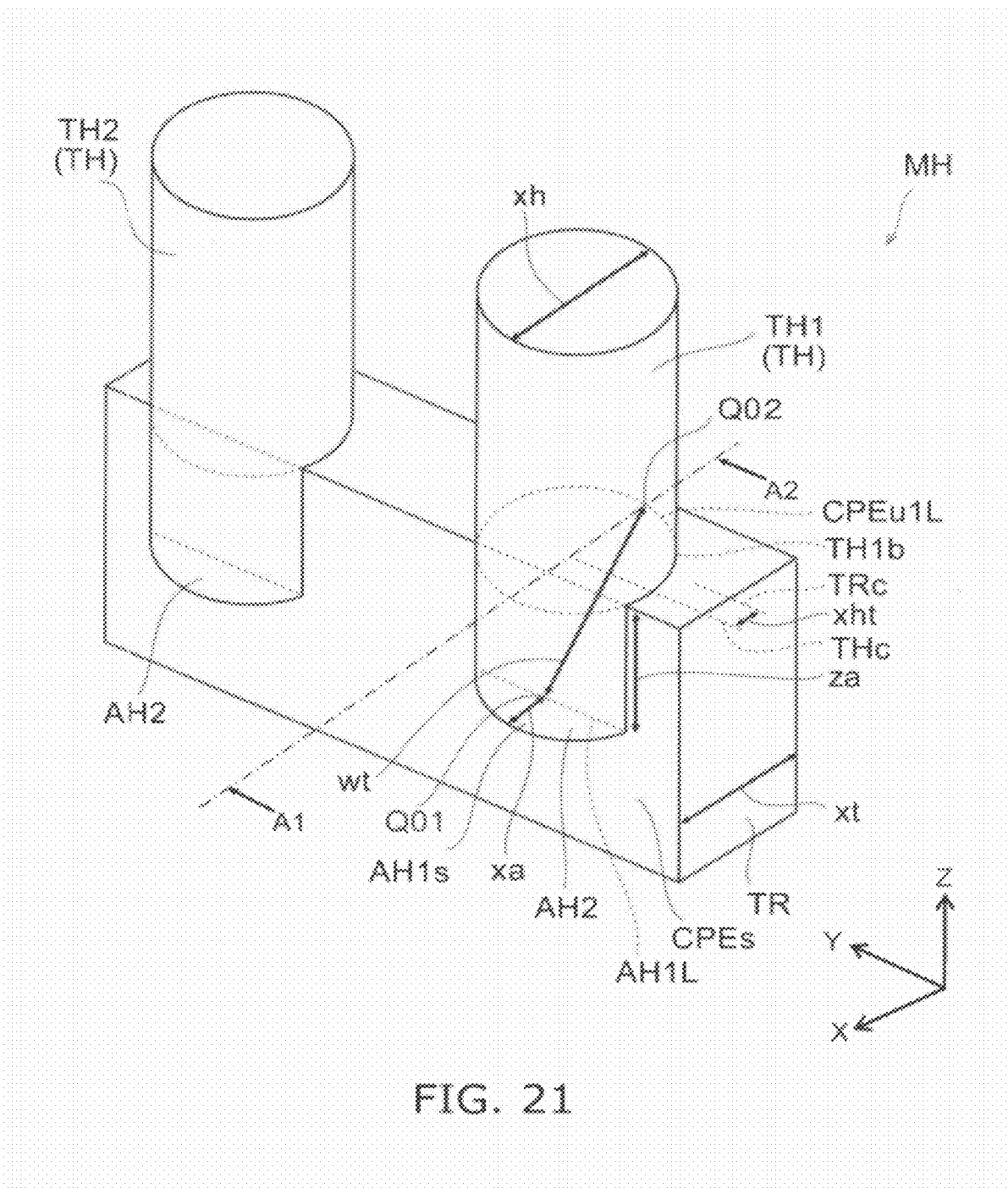
FIG. 21 is a schematic perspective view illustrating a process of the method for manufacturing the nonvolatile semiconductor memory device according to the first embodiment.

FIG. 21 is a schematic perspective view illustrating a process of the method for manufacturing the nonvolatile semiconductor memory device according to the first embodiment.

That is, the drawing illustrates the memory hole MH virtually, and is a virtual schematic view as seen through the stacked structure body ML and the underlayer UL around the memory hole MH.

The shape of the second additional hole AH2 may be set identical to the shape of the first additional hole AH1, and the disposition in the X-axis direction and the Z-axis direction of the second additional hole AH2 may be set identical to the disposition in the X-axis direction and the Z-axis direction of the first additional hole AH1. Therefore, hereinbelow, the first additional hole AH1 is described.

As illustrated in FIG. 19 to FIG. 21, the position in the X-axis direction of the center TRc in the X-axis direction of the trench TR shifts from the position in the X-axis direction of the center THc in the X-axis direction of the first through hole TH1 along the X-axis direction.

A shift amount xht that is the distance along the X-axis direction between the center TRc and the center THc corresponds to the mask misalignment and the dimensional variation in design in the process of forming the trench TR and the process of forming the through hole TH.

That is, as illustrated in FIG. 19, the first through hole TH1 is formed in the stacked film MLf in the position shifted from the center TRc along the X-axis direction of the trench TR. A hole is formed in the underlayer UL (e.g. the connection portion conductive layer BG) in the shifted position, and thereby the first additional hole AH1 is formed.

Here, the length along the X-axis direction of the diameter of the first through hole TH1 is referred to as a through hole diameter xh, and the width along the X-axis direction of the trench TR is referred to as a trench width xt.

The depth of the first additional hole AH1 from the upper face of the underlayer UL is referred to as an additional hole depth za. The maximum distance along the X-axis direction between the side face of the first additional hole AH1 and a side face of the trench TR on the first additional hole AH1 side is referred to as an additional hole width xa.

As illustrated in FIG. 20, the maximum length xb along the X-axis direction of the region in which the stacked structure body ML1 and the sacrifice layer SCf overlap is substantially equal to the additional hole width xa.

When the through hole diameter xh is not less than the trench width xt, the additional hole width xa is expressed by Formula 1 below.

$$xa = xht + (xh - xt)/2 \quad (1)$$

On the other hand, when the through hole diameter xh is less than the trench width xt, the additional hole width xa is expressed by Formula 2 below.

$$xa = xht - (xt - xh)/2 \quad (2)$$

In the nonvolatile semiconductor memory device 110, the additional hole AH is formed, and thereby the opening width of the connection portion between the through hole TH and the trench TR is set not less than the through hole diameter xh. Furthermore, the opening width of the connection portion between the through hole TH and the trench TR can be set not less than the trench width xt.

By providing the first additional hole AH1, a portion in which the opening width of the connection portion between the through hole TH and the trench TR is narrow is inclined with respect to the Z-axis direction.

As illustrated in FIG. 19 to FIG. 21, the distance wt between: the center Q01 in the Y-axis direction of the line segment AH1L of the contact between the underlayer UL and the sacrifice layer SCf at the bottom face AH1$s$ of the first additional hole AH1; and the center Q02 in the Y-axis direction of the lowermost end TH1$b$ of a side wall of the first through hole TH1 on the side opposed to the first additional hole AH1 in the X-axis direction corresponds to the opening width of the connection portion between the through hole TH and the trench TR.

In the nonvolatile semiconductor memory device 110, the distance wt along a direction inclined with respect to the Z-axis is set not less than a prescribed value.

The distance wt is set, for example, not less than the length (the through hole diameter xh) along the X-axis direction of the diameter of the first through hole TH.

The distance wt is set, for example, not less than the width (the trench width xt) along the X-axis direction of the trench TR.

That is, in the nonvolatile semiconductor memory device 119 of the comparative example described above, since the first additional hole AH1 is not provided, the direction of the opening width w0 of the connection portion between the through hole TH and the trench TR is a direction perpendicular to the Z-axis direction. Therefore, the opening width w0 is a value smaller than the through hole diameter xh by a width corresponding to the mask misalignment.

In contrast, in the nonvolatile semiconductor memory device 110 according to this embodiment, by forming the additional hole AH, the distance wt corresponding to the opening width of the connection portion between the through hole TH and the trench TR is a distance along a direction inclined with respect to the Z-axis direction. By appropriately setting the depth (the additional hole depth za) of the first additional hole AH1, the distance wt along the direction inclined with respect to the Z-axis direction can be set not less than the through hole diameter xh. Furthermore, the distance wt can be set not less than the trench width xt as well.

In the nonvolatile semiconductor memory device 110 and the method for manufacturing the same, the memory hole MH does not include a portion smaller than the through hole diameter xh (the diameter of the first through hole TH1 and the diameter of the second through hole TH2). Furthermore, the memory hole MH may not include a portion smaller than the trench width xt (the width along the X-axis direction of the trench TR).

A preferable size of the additional hole depth za will now be described as a preferable shape of the first additional hole AH1

As illustrated in FIG. 19 to FIG. 21, the additional hole depth za is expressed by Formula 3 below.

$$wt^2 = za^2 + (xh - xa)^2 \quad (3)$$

The condition that makes the distance wt not less than the through hole diameter xh is Formula 4 below.

$$za \geq (xh^2 - (xh - xa)^2)^{1/2} \quad (4)$$

By using Formula 1 and Formula 2, the condition that makes the distance wt not less than the through hole diameter xh is Formula 5 below.

$$za \geq (xh^2 - ((xh+xt)/2 - xht)^2)^{1/2} \quad (5)$$

On the other hand, the condition that makes the distance wt not less than the trench width xt is Formula 6 below.

$$za \geq (xt^2 - (xh - xa)^2)^{1/2} \quad (6)$$

By using Formula 1 and Formula 2, the condition that makes the distance wt not less than the trench width xt is Formula 7 below.

$$za \geq (xt^2 - ((xh+xt)/2 - xht)^2)^{1/2} \quad (7)$$

In the case where the through hole diameter xh is not more than the trench width xt, the distance wt is preferably not less than the through hole diameter xh. That is, it is preferable that Formula 4 and Formula 5 hold.

In the case where the trench width xt is not more than the through hole diameter xh, the distance wt is preferably not less than the trench width xt. That is, it is preferable that Formula 6 and Formula 7 hold.

That is, the underlayer UL exposed from the through hole TH is dug with a sufficient depth during the processing of the memory hole MH. Thereby, the dimension of a portion of the memory hole MH which may be blocked due to the mask misalignment, the dimensional variation, and the like can be expanded.

Thereby, as illustrated in FIG. 20 and FIG. 21, when the sacrifice layer SCf is removed to form the memory hole MH, the memory hole MH does not include a portion narrower than the through hole diameter xh and the trench width xt.

In the nonvolatile semiconductor memory device 110 according to this embodiment, the semiconductor connection portion CP is formed in accordance with the shapes of the trench TR, the first additional hole AH1, and the second additional hole AH2 of the memory hole MH. That is, the stacked insulating film 47 is formed on the inner wall of the trench TR and the semiconductor layer SPf is formed thereinside to form the end connection portion CPE. Then, the stacked insulating film 47 is formed on the inner walls of the first additional hole AH1 and the second additional hole AH2 and the semiconductor layer SPf is formed thereinside to form the first protrusion CPP1 and the second protrusion CPP2.

Figure 22:
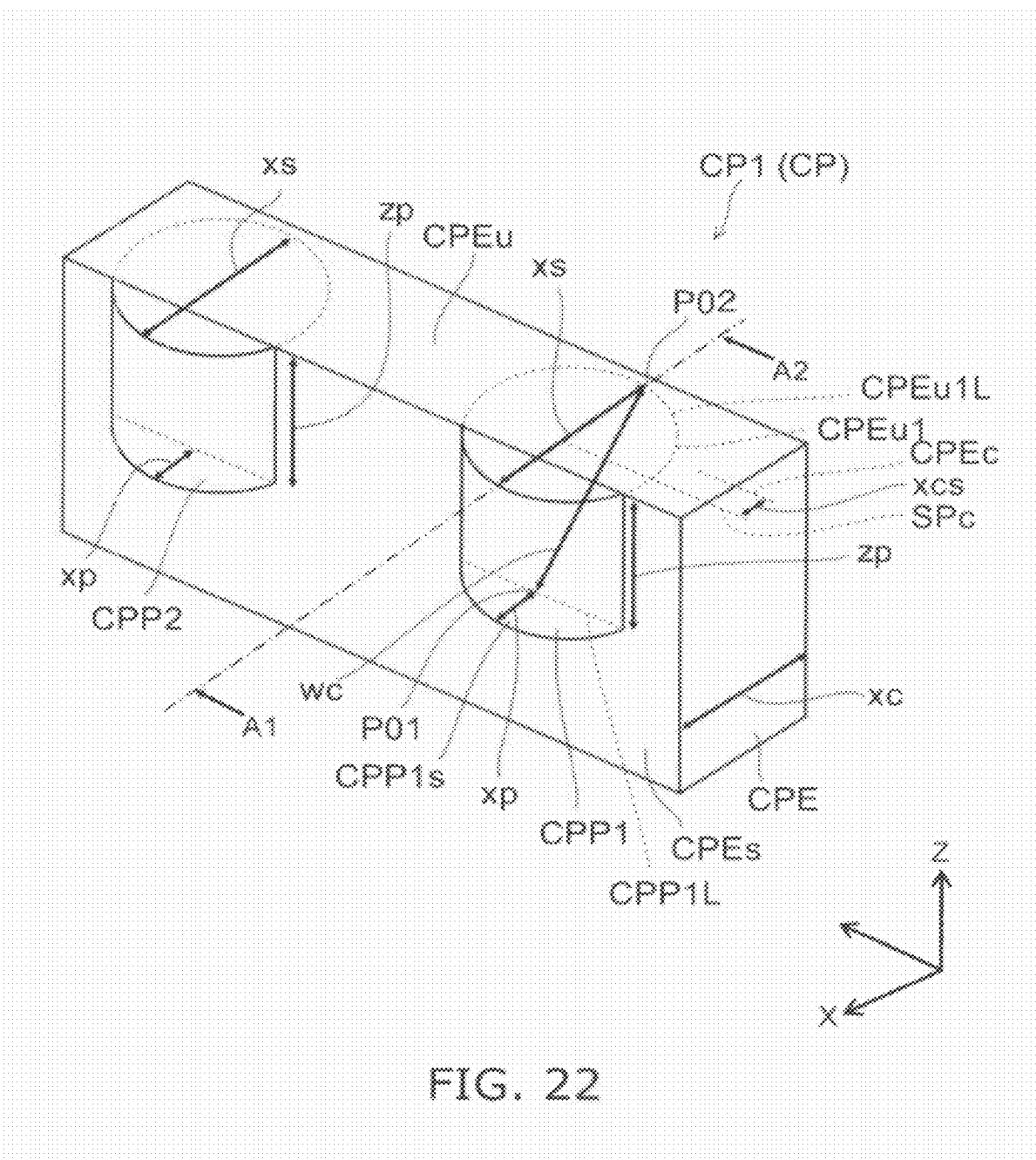
FIG. 22 is a schematic perspective view illustrating the configuration of a relevant part of the nonvolatile semiconductor memory device according to the first embodiment.

FIG. 22 is a schematic perspective view illustrating the configuration of a relevant part of the nonvolatile semiconductor memory device according to the first embodiment.

That is, the drawing illustrates the configuration of the semiconductor connection portion CP.

Figure 23:
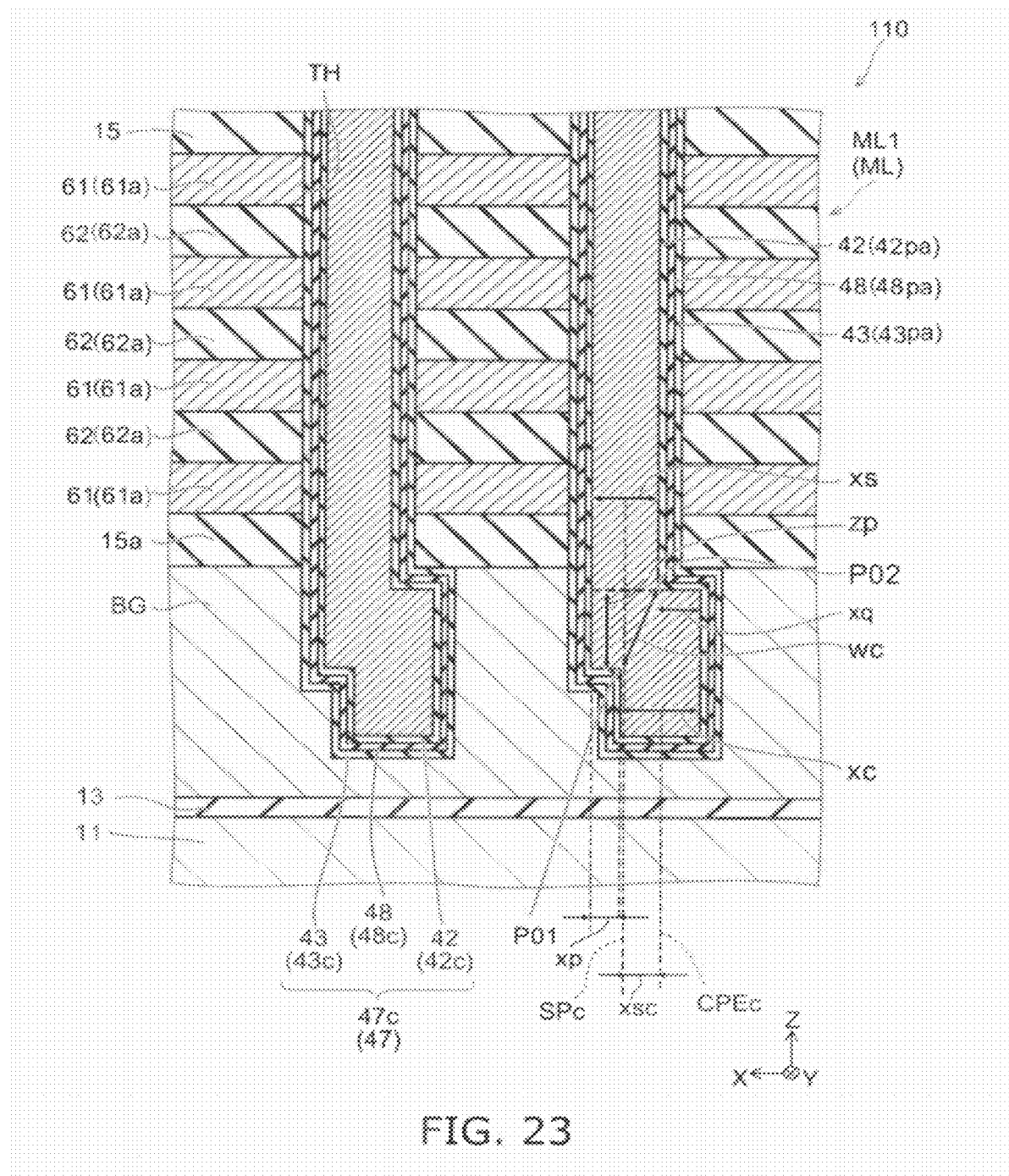
FIG. 23 is a schematic cross-sectional view illustrating the configuration of a relevant part of the nonvolatile semiconductor memory device according to the first embodiment.

FIG. 23 is a schematic cross-sectional view illustrating the configuration of a relevant part of the nonvolatile semiconductor memory device according to the first embodiment.

That is, the drawing is a cross-sectional view corresponding to the cross section along line A1-A2 of FIG. 1 and corresponding to the cross section along line A-A' of FIG. 2.

In the case where the thickness of the stacked insulating film 47 is substantially uniform, the shape of the semiconductor pillar SP corresponds to the shape of the through hole TH, the shape of the end connection portion CPE of the semiconductor connection portion CP corresponds to the shape of the trench TR, and the shapes of the first protrusion CPP1 and the second protrusion CPP2 of the semiconductor connection portion CP correspond to the shapes of the first additional hole AH1 and the second additional hole AH2, respectively.

As illustrated in FIG. 22 and FIG. 23, the length along the X-axis direction of the diameter of the first semiconductor pillar SP1 is referred to as a semiconductor pillar diameter xs. The semiconductor pillar diameter xs corresponds to, for example, a value obtained by subtracting twice the thickness of the stacked insulating film 47 from the through hole diameter xh.

The width along the X-axis direction of the end connection portion CPE is referred to as an end connection portion width xc. The end connection portion width xc corresponds to, for example, a value obtained by subtracting twice the thickness of the stacked insulating film 47 from the trench width xt.

The maximum distance along the X-axis direction between the side face of the first protrusion CPP1 and the connection portion side face CPEs is referred to as a protrusion width xp. The protrusion width xp corresponds to, for example, a value obtained by subtracting the thickness of the stacked insulating film 47 from the additional hole width xa.

As described above, the distance along the X-axis direction between the center CPEc in the X-axis direction of the end connection portion CPE and the center SPc in the X-axis direction of the first semiconductor pillar SP1 is referred to as the shift amount xcs.

The following are deduced in regard to the semiconductor pillar SP, the end connection portion CPE, and the first protrusion CPP1, corresponding to Formula 1 to Formula 7 in regard to the through hole TH, the trench TR, and the first additional hole AH1.

When the semiconductor pillar diameter xs is not less than the end connection portion width xc, the protrusion width xp is expressed by Formula 8 below.

$$xp = xcs + (xs-xc)/2 \tag{8}$$

On the other hand, when the semiconductor pillar diameter xs is less than the end connection portion width xc, the protrusion width xp is expressed by Formula 9 below.

$$xp = xcs - (xc-xs)/2 \tag{9}$$

Here, the shift amount xcs is a value substantially equal to the shift amount xht caused by the mask misalignment and the dimensional variation in the process of forming the trench TR and the process of forming the through hole TH.

As illustrated in FIG. 22 and FIG. 23, by providing the first protrusion CPP1, a portion with a narrow width of the connection portion between the first semiconductor pillar SP1 and the end connection portion CPE is inclined with respect to the Z-axis direction.

The distance wc between: the center P01 in the Y-axis direction of a first protrusion end line CPP1L at which a first protrusion end face CPP1s of the first protrusion portion CPP1 on the side opposite to the first semiconductor pillar SP1 intersects with the connection portion side face CPEs; and the center P02 in the Y-axis direction of a first periphery line CPEu1L on the side opposite to the first protrusion CPP1 of a first connection face CPEu1 of the end connection portion CPE in contact with the first semiconductor pillar SP1 corresponds to the width of a portion with a narrow width of the connection portion between the first semiconductor pillar SP1 and the end connection portion CPE.

In the nonvolatile semiconductor memory device 110, the distance wc along an inclined direction is set not less than a prescribed value.

The distance wc is set not less than the length (the semiconductor pillar diameter xs) along the X-axis direction of the diameter of the first semiconductor pillar SP1.

The distance wc is set not less than the width (the end connection portion width xc) along the X-axis direction of the end connection portion CPE.

In the nonvolatile semiconductor memory device 110, by providing the first protrusion CPP1 and the second protrusion CPP2, the distance wc corresponding to the width of the connection portion between the first semiconductor pillar SP1 and the end connection portion CPE is a distance along an direction inclined with respect to the Z-axis direction. By appropriately setting the depth (a protrusion depth zp) of the first protrusion CPP1, the distance wc along the inclined direction can be set not less than the semiconductor pillar diameter xs. Furthermore, the distance wc can be set not less than the end connection portion width xc as well.

That is, in the nonvolatile semiconductor memory device 110, by providing the first protrusion CPP1 and the second protrusion CPP2, the semiconductor connection portion CP does not include a portion smaller than the semiconductor pillar diameter xs (the diameter of the first semiconductor pillar SP1 and the diameter of the second semiconductor pillar SP2). Furthermore, the semiconductor connection portion CP may not include a portion smaller than the end connection portion width xc (the width along the X-axis direction of the end connection portion CPE) as well.

A preferable size of the protrusion depth zp will now be described as a preferable shape of the first protrusion CPP1.

As illustrated in FIG. 22 and FIG. 23, the protrusion depth zp is expressed by Formula 10 below.)

$$wc^2 = zp^2 + (xs-xp)^2 \tag{10}$$

The condition that makes the distance wc not less than the semiconductor pillar diameter xs is Formula 11 below.

$$zp \geq (xs^2 - (xs-xp)^2)^{1/2} \tag{11}$$

By using Formula 8 and Formula 9, the condition that makes the distance wc not less than the semiconductor pillar diameter xs is Formula 12 below.

$$zp \geq (xs^2 - ((xs+xc)/2 - xcs)^2)^{1/2} \tag{12}$$

On the other hand, the condition that makes the distance wc not less than the end connection portion width xc is Formula 13 below.

$$zp \geq (xc^2 - (xs-xp)^2)^{1/2} \tag{13}$$

By using Formula 8 and Formula 9, the condition that makes the distance wc not less than the end connection portion width xc is Formula 14 below.

$$zp \geq (xc^2 - ((xs+xc)/2 - xcs)^2)^{1/2} \tag{14}$$

In the case where the semiconductor pillar diameter xs is not more than the end connection portion width xc, the distance wc is preferably not less than the semiconductor pillar diameter xs. That is, it is preferable that Formula 11 and Formula 12 hold.

In the case where the end connection portion width xc is not more than the semiconductor pillar diameter xs, the distance wc is preferably not less than the end connection portion width xc. That is, it is preferable that Formula 13 and Formula 14 hold.

Thereby, as illustrated in FIG. 22 and FIG. 23, the semiconductor connection portion CP does not include a portion smaller than the semiconductor pillar diameter xs. Furthermore, the semiconductor connection portion CP does not include a portion smaller than the end connection portion width xc. The semiconductor connection portion CP like this can be formed by using the memory hole MH not including a portion narrower than the through hole diameter xh and the trench width xt.

According to the nonvolatile semiconductor memory device 110 and the method for manufacturing the same, the allowable margin of mask alignment accuracy and dimensional accuracy can be expanded.

Figure 24A:
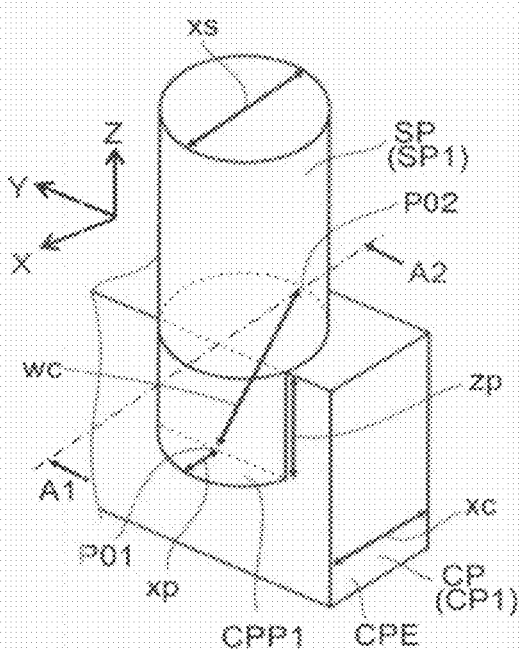
FIG. 24A and FIG. 24B are schematic views illustrating the configuration of another nonvolatile semiconductor memory device according to the first embodiment.
Figure 24B:
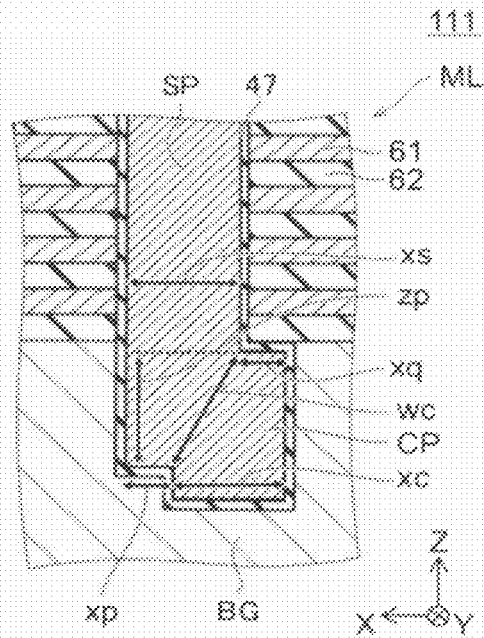

FIG. 24A and FIG. 24B are schematic views illustrating the configuration of another nonvolatile semiconductor memory device according to the first embodiment.

These drawings illustrate the configuration of the connection portion between the semiconductor pillar SP and the semiconductor connection portion CP in another nonvolatile semiconductor memory device 111 according to this embodiment. FIG. 24A is a schematic perspective view and FIG. 24B is a cross-sectional view taken along line A1-A2 of FIG. 24A.

As illustrated in FIG. 24A and FIG. 24B, in the nonvolatile semiconductor memory device 111, the protrusion depth zp of the first protrusion CPP1 is relatively large. Therefore, the distance wc corresponding to the width of the connection portion between the first semiconductor pillar SP1 and the end connection portion CPE and running along a direction inclined to the Z-axis direction is very large.

For example, in the nonvolatile semiconductor memory device 111, Formula 15 to Formula 18 below are satisfied.

$$zp > (xs^2 - (xs-xp)^2)^{1/2} \quad (15)$$

$$zp > (xs^2 - ((xs+xc)/2 - xcs)^2)^{1/2} \quad (16)$$

$$zp > (xc^2 - (xs-xp)^2)^{1/2} \quad (17)$$

$$zp > (xc^2 - ((xs+xc)/2 - xcs)^2)^{1/2} \quad (18)$$

In the nonvolatile semiconductor memory device 111, the protrusion depth zp is set very large, and the additional hole depth za is set very large in the process of manufacturing the nonvolatile semiconductor memory device 111. Therefore, when the memory hole MH is formed, the memory hole MH does not include a portion narrower than the through hole diameter xh and the trench width xt. Thereby, the interior of the memory hole MH can be filled with the stacked insulating film 47 and the semiconductor layer SPf sufficiently and uniformly. Thereby, the allowable margin of mask alignment accuracy and dimensional accuracy can be expanded.

Figure 25A:
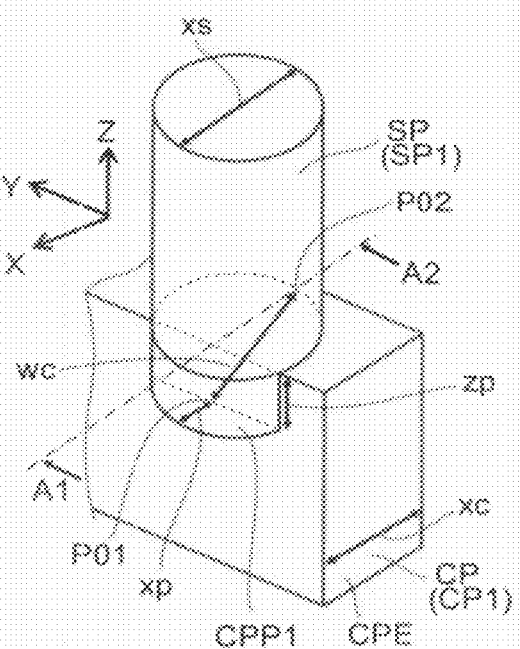
FIG. 25A and FIG. 25B are schematic views illustrating the configuration of another nonvolatile semiconductor memory device according to the first embodiment.
Figure 25B:
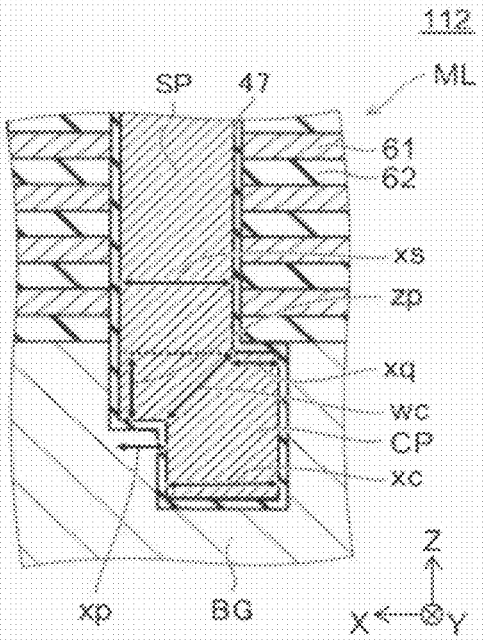

FIG. 25A and FIG. 25B are schematic views illustrating the configuration of another nonvolatile semiconductor memory device according to the first embodiment.

These drawings illustrate the configuration of the connection portion between the semiconductor pillar SP and the semiconductor connection portion CP in another nonvolatile semiconductor memory device 112 according to this embodiment. FIG. 25A is a schematic perspective view, and FIG. 25B is a cross-sectional view taken along line A1-A2 of FIG. 25A.

As illustrated in FIG. 25A and FIG. 25B, in the nonvolatile semiconductor memory device 112, the protrusion depth zp of the first protrusion CPP1 is set smaller than the nonvolatile semiconductor memory device 110. However, also the nonvolatile semiconductor memory device 112 satisfies Formula 11 to Formula 14.

That is, the distance wc is set substantially equal to the semiconductor pillar diameter xs. For example, the nonvolatile semiconductor memory device 112 satisfies Formula 19 and Formula 20 below.

$$zp = (xs^2 - (xs-xp)^2)^{1/2} \quad (19)$$

$$zp = (xs^2 - ((xs+xc)/2 - xcs)^2)^{1/2} \quad (20)$$

For example, the distance wc is set substantially equal to the end connection portion width xc. For example, the nonvolatile semiconductor memory device 112 satisfies Formula 21 and Formula 22 below.

$$zp = (xc^2 - (xs-xp)^2)^{1/2} \quad (21)$$

$$zp = (xc^2 - ((xs+xc)/2 - xcs)^2)^{1/2} \quad (22)$$

Thus, the distance wc is set not less than the semiconductor pillar diameter xs, and thereby the protrusion depth xp is set relatively large in the nonvolatile semiconductor memory device 112. That is, also in the process of manufacturing the nonvolatile semiconductor memory device 112, the additional hole depth za is set relatively large. Thereby, the interior of the memory hole MH can be filled with the stacked insulating film 47 and the semiconductor layer SPf sufficiently and uniformly. Thereby, the allowable margin of mask alignment accuracy and dimensional accuracy can be expanded.

FIG. 26A and FIG. 26B are schematic views illustrating the configuration of a nonvolatile semiconductor memory device of a comparative example.

These drawings illustrate the configuration of the connection portion between the semiconductor pillar SP and the semiconductor connection portion CP in the nonvolatile semiconductor memory device 119 of the comparative example. FIG. 26A is a schematic perspective view, and FIG. 26B is a cross-sectional view taken along line A1-A2 of FIG. 26A.

As illustrated in FIG. 26A and FIG. 26B, the nonvolatile semiconductor memory device 119 of the comparative example does not include the first protrusion CPP1.

Alternatively, even in the case where the first protrusion CPP1 is provided, the protrusion depth zp is set small and Formula 11 to Formula 14 are not satisfied.

Therefore, the distance wc is smaller than the semiconductor pillar diameter xs. Further, the distance wc is smaller than the end connection portion width xc.

In the process of manufacturing the nonvolatile semiconductor memory device 119, the additional hole depth za is set small. Thereby, it may be difficult to fill the interior of the memory hole MH with the stacked insulating film 47 and the semiconductor layer SPf sufficiently.

If over-etching is performed during forming the through hole TH, the first additional hole AH1 and the second additional hole AH2 may be formed unintendedly. In this case, since setting the additional hole depth za not less than a prescribed value is not considered, Formula 4 to Formula 7 are not satisfied. Therefore, in the case where the first additional hole AH1 and the second additional hole AH2 are formed unintendedly, also in regard to the first protrusion CPP1 and the second protrusion CPP2 formed to accompany that, the protrusion depth zp is insufficient and Formula 11 to Formula 14 are not satisfied.

As an example of the configuration of the nonvolatile semiconductor memory device according to this embodiment, the configuration of the nonvolatile semiconductor memory device 110 will be further described with reference to FIG. 2.

In the matrix memory cell unit MU1, an interlayer insulating film 16, for example, is provided between the stacked structure body ML and the select gate electrode SG. An interlayer insulating film 17 dividing the select gate electrode SG along a direction perpendicular to the Z-axis direction is provided. In this specific example, the direction in which the divided select gate electrodes SG extend is the X-axis direction. That is, in this specific example, the interlayer insulating film 17 extends along the X-axis direction.

A first select gate insulating film (select gate insulating film SGI) is provided between the first select gate electrode SG1 and the first semiconductor pillar SP1, and a second select gate insulating film (select gate insulating film SGI) is provided between the second select gate electrode SG2 and the second semiconductor pillar SP2.

For the select gate insulating film SGI, a stacked film of the inner insulating film 42, the memory layer 48, and the outer insulating film 43 may be used, and also an insulating film different from the stacked film of the inner insulating film 42, the memory layer 48, and the outer insulating film 43 may be used. The select gate insulating film SGI may be either a single layer film or a stacked film.

An interlayer insulating film 18 is provided on the interlayer insulating film 17, and the source line SL and a via 22 are provided thereon. An interlayer insulating film 19 is provided around the source line SL. The via 22 includes, for example, a stacked film of a barrier layer 20 and a metal layer 21.

An interlayer insulating film 23 is provided on the source line SL, and the bit line BL is provided thereon. The bit line BL has a strip shape along the Y-axis, for example. Silicon oxide, for example, may be used for the interlayer insulating films 16, 17, 18, 19, and 23.

FIG. 27 is a schematic plan view illustrating the configuration of an electrode film of the nonvolatile semiconductor memory device according to the first embodiment.

As illustrated in FIG. 27, for example, the electrode films 61 corresponding to the first semiconductor pillar SP1 and the fourth semiconductor pillar SP4 are commonly connected to form an electrode film 61A. The electrode films 61 corresponding to the second semiconductor pillar SP2 and the third semiconductor pillar SP3 are commonly connected to form an electrode film 61B. In other words, the electrode film 61 has a form in which the electrode film 61A and the electrode film 61B are combined with each other in a comb teeth configuration opposing along the X-axis direction.

As illustrated in FIG. 27, the electrode film 61A and the electrode film 61B are divided from each other by an insulating layer IL.

As illustrated in FIG. 2, in the memory unit MU, the interconnection connecting unit MU2 is juxtaposed to the matrix memory cell unit MU1. The interconnection connecting unit MU2 connects the interconnections extending from the matrix memory cell unit MU1.

In the interconnection connecting unit MU2, the electrode film 61B is connected to a word interconnection 32 by a via plug 31 at one end in the X-axis direction to be electrically connected to, for example, a drive circuit provided in the semiconductor substrate 11. Similarly, the electrode film 61A is connected to the word interconnection by a via plug at the other end in the X-axis direction to be electrically connected to the drive circuit (not illustrated in FIG. 2). In other words, the length in the X-axis direction of each of the electrode films 61 (the electrode films 61A and the electrode films 61B) stacked along the Z-axis direction changes in a stairstep configuration; the electrode film 61A is electrically connected to the drive circuit at one end in the X-axis direction; and the electrode film 61B is electrically connected to the drive circuit at the other end in the X-axis direction. Although the via plug 31 is connected to each of the electrode films 61 at the same position in the Y-axis direction in FIG. 2 for the sake of convenience, the via plugs 31 corresponding to the electrode films 61 are provided in different positions in the Y-axis direction.

Thereby, in the electrode film 61 at a certain distance from the semiconductor substrate 11, the electric potential can be set different between the first semiconductor pillar SP1 and the second semiconductor pillar SP2 which constitute a pair. Thereby, the memory cells MC in this layer corresponding to the first semiconductor pillar SP1 and the second semiconductor pillar SP2 can operate independently from each other. This applies also to the third semiconductor pillar SP3 and the fourth semiconductor pillar SP4.

The connection portion conductive layer BG (back gate) is connected to a back gate interconnection 34 by a via plug 33, for example.

As illustrated in FIG. 2, in the periphery circuit region PR, various periphery circuits PR1, for example, are provided on the semiconductor substrate 11. The periphery circuits PR1 are connected to, for example, the bit line BL, the source line SL, the word interconnection 32, the back gate interconnection 34, and the select gate electrode SG to control the memory state of the memory cell MC.

Second Embodiment

Figure 28A:
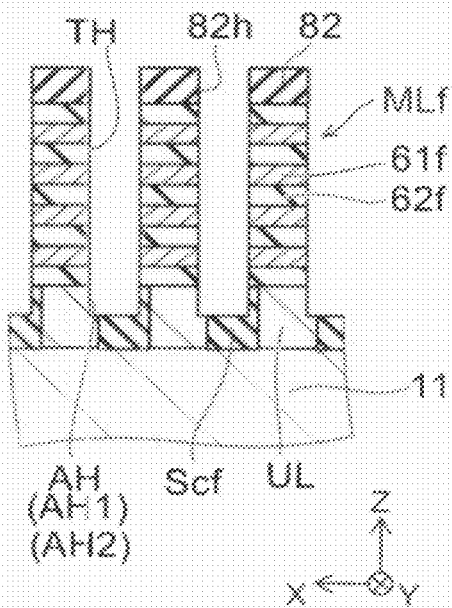
FIG. 28A, FIG. 28B, and FIG. 28C are schematic cross-sectional views illustrating a method for manufacturing a nonvolatile semiconductor memory device according to a second embodiment.
Figure 28B:
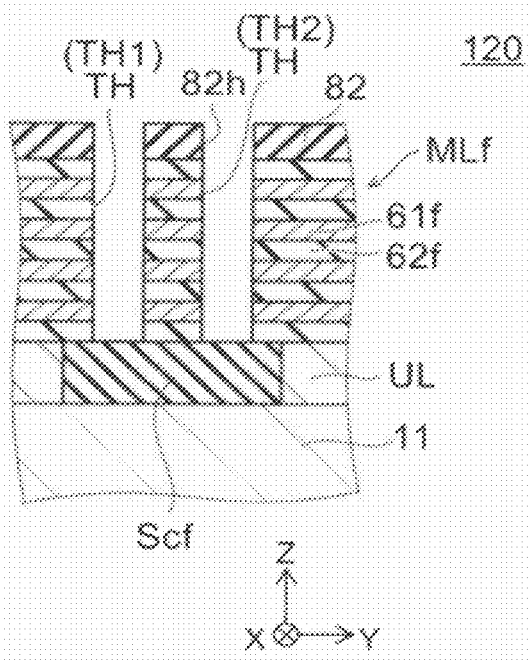
Figure 28C:
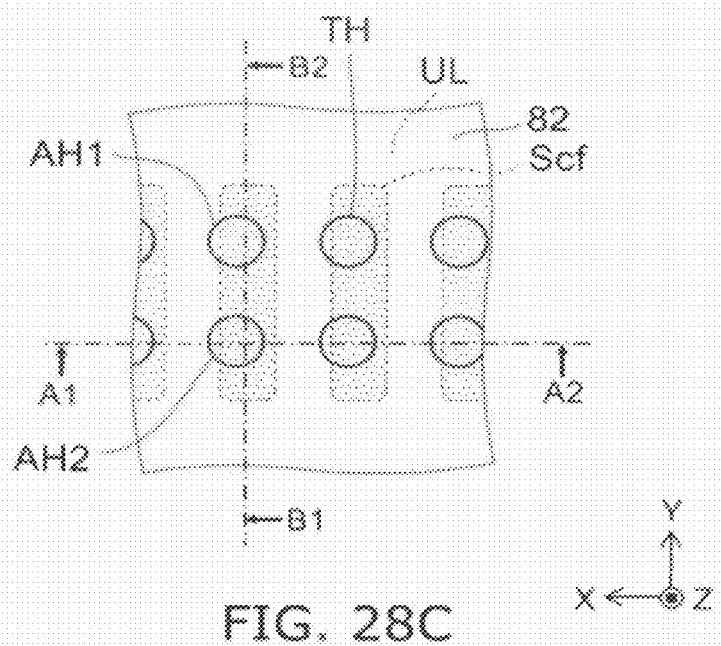

FIG. 28A, FIG. 28B, and FIG. 28C are schematic cross-sectional views illustrating a method for manufacturing a nonvolatile semiconductor memory device according to a second embodiment.

That is, FIG. 28C is a plan view, FIG. 28A is a cross-sectional view taken along line A1-A2 of FIG. 28C, and FIG. 28B is a cross-sectional view taken along line B1-B2 of FIG. 28C. These drawings illustrate a process corresponding to the process illustrated in FIGS. 12A to 12C.

The configuration of a nonvolatile semiconductor memory device 120 according to this embodiment may be similar the configuration of the nonvolatile semiconductor memory device 110, and a description is therefore omitted. Part of the method for manufacturing the nonvolatile semiconductor memory device 120 is different from the method for manufacturing the nonvolatile semiconductor memory device 110.

In the method for manufacturing the nonvolatile semiconductor memory device 120, step S110 to step S150 are similar to the nonvolatile semiconductor memory device 110.

In the nonvolatile semiconductor memory device 120, the through holes TH (the first through hole TH1 and the second through hole TH2) are formed in the stacked film MLf (step S150).

Then, as illustrated in FIG. 28A, FIG. 28B, and FIG. 28C, the mask member 82 is used as a mask to dig the underlayer UL and the sacrifice layer SCf exposed from the through holes TH to form the additional holes AH.

That is, the formation of the first additional hole AH1 and the formation of the second additional hole AH2 (step S160) include a process that removes at least a part of the sacrifice layer SCf exposed from the first through hole TH1 and the second through hole TH2.

After this process, similar processes to the nonvolatile semiconductor memory device 110 are performed to form the nonvolatile semiconductor memory device 120.

Figure 29:
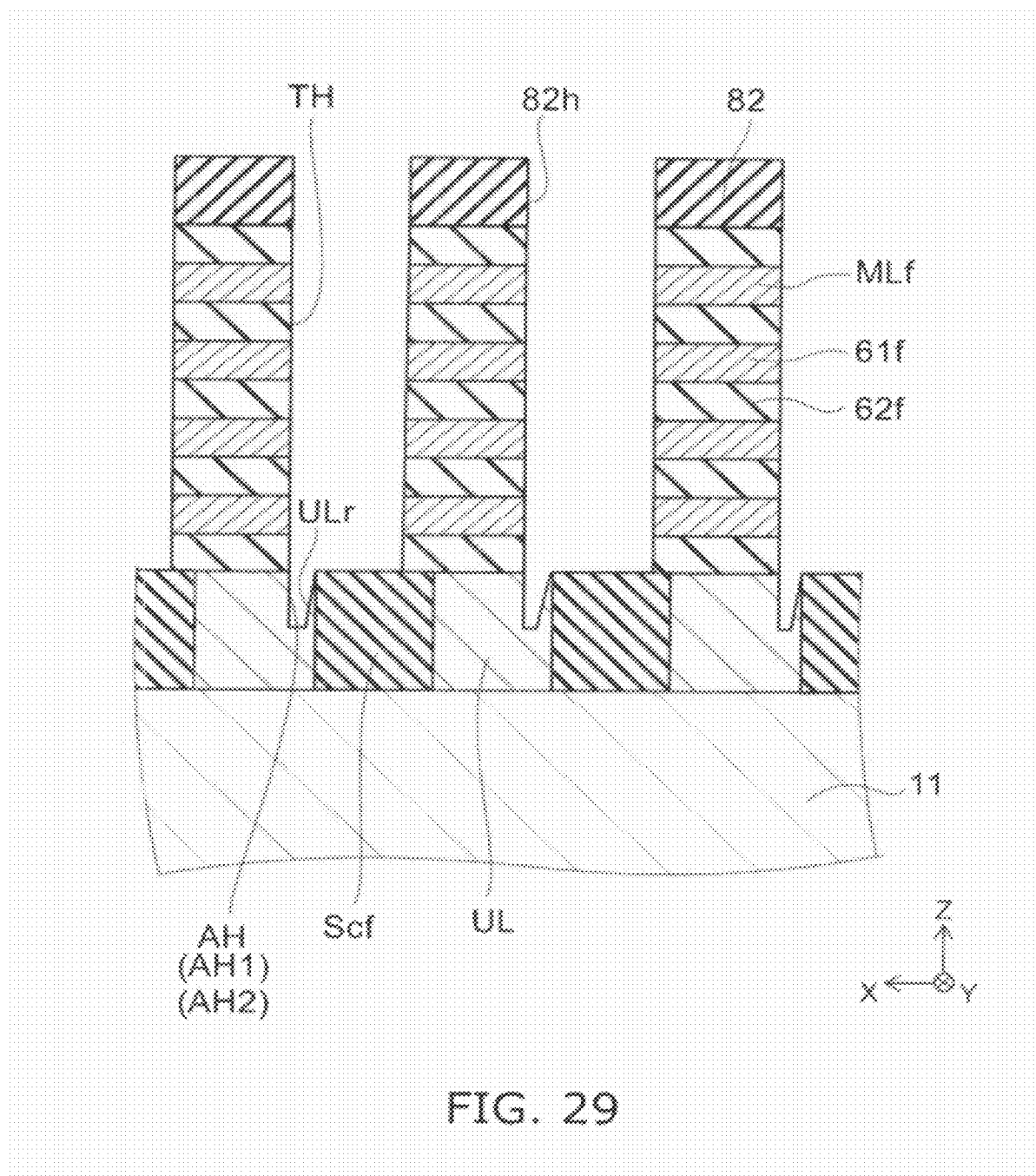
FIG. 29 is a schematic cross-sectional view illustrating a method for manufacturing a nonvolatile semiconductor memory device.

FIG. 29 is a schematic cross-sectional view illustrating a method for manufacturing a nonvolatile semiconductor memory device.

The drawing illustrates a state of the underlayer UL in the case where the sacrifice layer SCf is not removed together with the underlayer UL during the formation of the first additional hole AH1 and the formation of the second additional hole AH2 (step S160).

As illustrated in FIG. 29, in the case where, in step S160, the removal of the sacrifice layer SCf exposed from the first through hole TH1 and the second through hole TH2 is not performed together with the formation of the first additional hole AH1 and the formation of the second additional hole AH2, a part of the underlayer UL in a region under the shade of the sacrifice layer SCf may be left to form a fence-like residue ULr.

In contrast, as illustrated in FIG. 28A to FIG. 28C, in step S160 in the nonvolatile semiconductor memory device 120, the removal of the sacrifice layer SCf exposed from the first through hole TH1 and the second through hole TH2 is performed together with the formation of the first additional hole AH1 and the formation of the second additional hole AH2. This enables to suppress the generation of the fence-like residue ULr, and further enables stable production.

Third Embodiment

Figure 30:
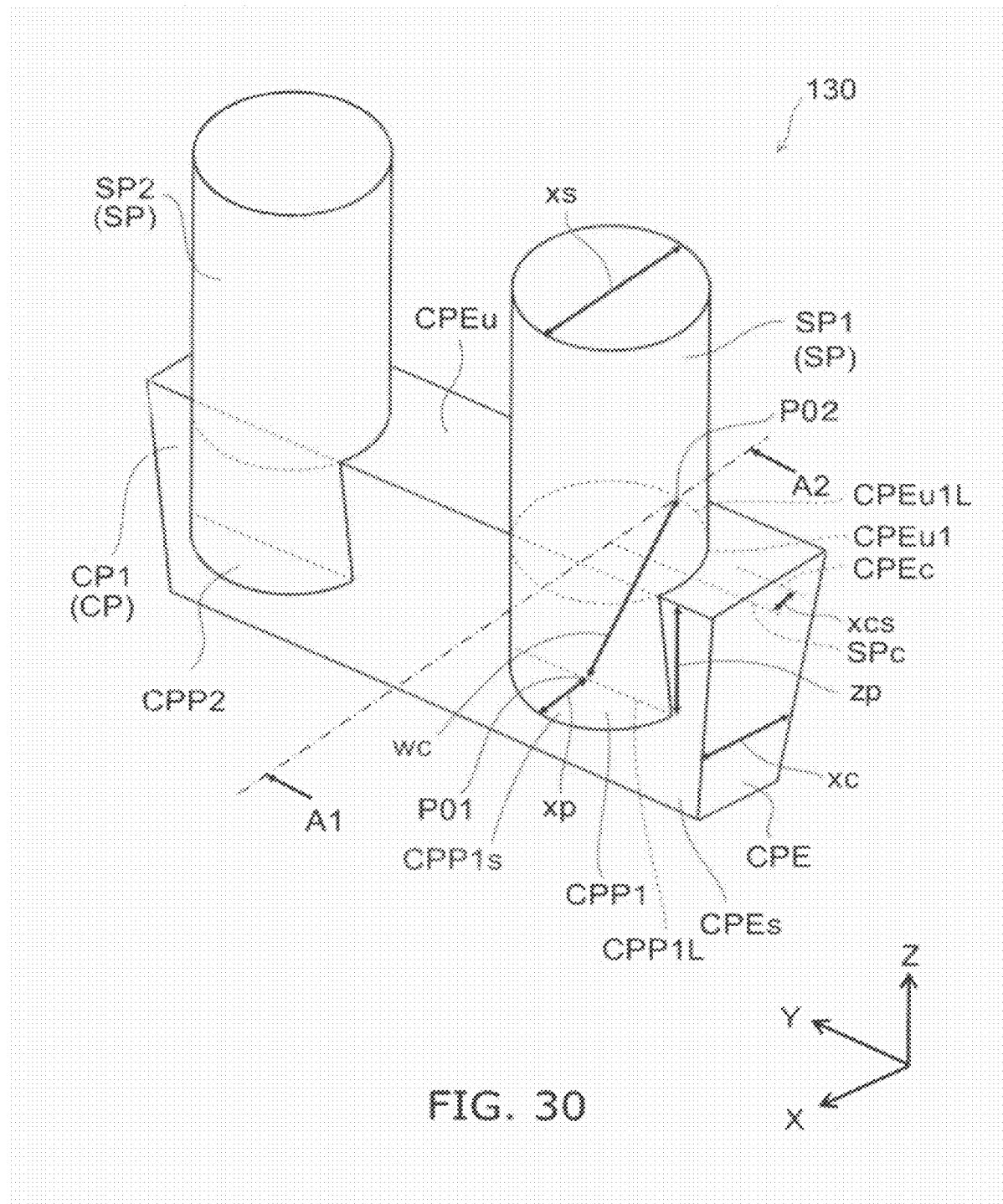
FIG. 30 is a schematic perspective view illustrating the configuration of a nonvolatile semiconductor memory device according to a third embodiment.

FIG. 30 is a schematic perspective view illustrating the configuration of a nonvolatile semiconductor memory device according to a third embodiment.

That is, the drawing illustrates the configuration of the semiconductor pillar SP and the semiconductor connection portion CP of a nonvolatile semiconductor memory device 130 according to this embodiment.

As illustrated in FIG. 30, also in the nonvolatile semiconductor memory device 130, the semiconductor connection portion CP includes the end connection portion CPE, the first protrusion CPP1, and the second protrusion CPP2.

In the nonvolatile semiconductor memory device 130, the side face (the connection portion side face CPEs) of the end connection portion CPE at which the first protrusion CPP1 and the second protrusion CPP2 are provided is inclined with respect to the Z-axis direction. Also in this case, the connection portion side face CPEs runs along the Y-axis direction.

Also in such a configuration, by appropriately setting the depth (the protrusion depth zp) of the first protrusion CPP1 and the second protrusion CPP2, a state can be created in which the semiconductor connection portion CP does not include a portion smaller than the semiconductor pillar diameter xs. Furthermore, a state can be created in which the semiconductor connection portion CP does not include a portion smaller than the end connection portion width xc.

The configuration in which the connection portion side face CPEs is inclined with respect to the Z-axis direction can be formed by forming the trench TR so that the wall face of the trench TR may have a tapered shape inclined with respect to the Z-axis direction.

In the case where the wall face of the trench TR has a tapered shape, the distance between the center Q01 (the center P01) and the center Q02 (the center P02) has relationships different from the relationships of Formula 3 and Formula 10 in the case where the wall face of the trench TR is parallel to the Z-axis direction. However, in the case where the wall face of the trench TR has a tapered shape, also the ease with which the stacked insulating film 47 and the semiconductor layer SPf are filled in the space in the trench TR changes.

Therefore, practically, by satisfying Formula 11 to Formula 14, a good filling property of the stacked insulating film 47 and the semiconductor layer SPf in the space in the trench TR is obtained. Furthermore, by satisfying Formula 4 to Formula 7, a good connection between the semiconductor pillar SP and the end connection portion CPE is obtained.

For example, in the case where the width along the X-axis direction of the end connection portion CPE changes along the Z-axis direction as in such cases as where the connection portion side face CPEs is inclined with respect to the Z-axis direction, the end connection portion width xc is defined as, for example, a value of the width along the X-axis direction of the end connection portion CPE averaged along the Z-axis direction.

Similarly, in the case where the width along the X-axis direction of the trench TR changes along the Z-axis direction, the trench width xt is defined as, for example, a value of the width along the X-axis direction of the trench TR averaged along the Z-axis direction.

In the case where the diameter along the X-axis direction of the semiconductor pillar SP changes along the Z-axis direction, the semiconductor pillar diameter xs is defined as, for example, a value of the diameter along the X-axis direction of the semiconductor pillar SP averaged along the Z-axis direction. Alternatively, the semiconductor pillar diameter xs may be defined as, for example, the diameter along the X-axis direction of the semiconductor pillar SP of the lowermost end of the semiconductor pillar SP (the portion in which the semiconductor pillar SP and the semiconductor connection portion CP are connected).

Similarly, in the case where the diameter along the X-axis direction of the through hole TH changes along the Z-axis direction, the through hole diameter xh is defined as, for example, a value of the diameter along the X-axis direction of the through hole TH averaged along the Z-axis direction. Alternatively, the through hole diameter xh may be defined as, for example, the diameter along the X-axis direction of the through hole TH of the lowermost end of the through hole TH (the portion in which the through hole TH and the trench TR are connected).

Fourth Embodiment

Figure 31:
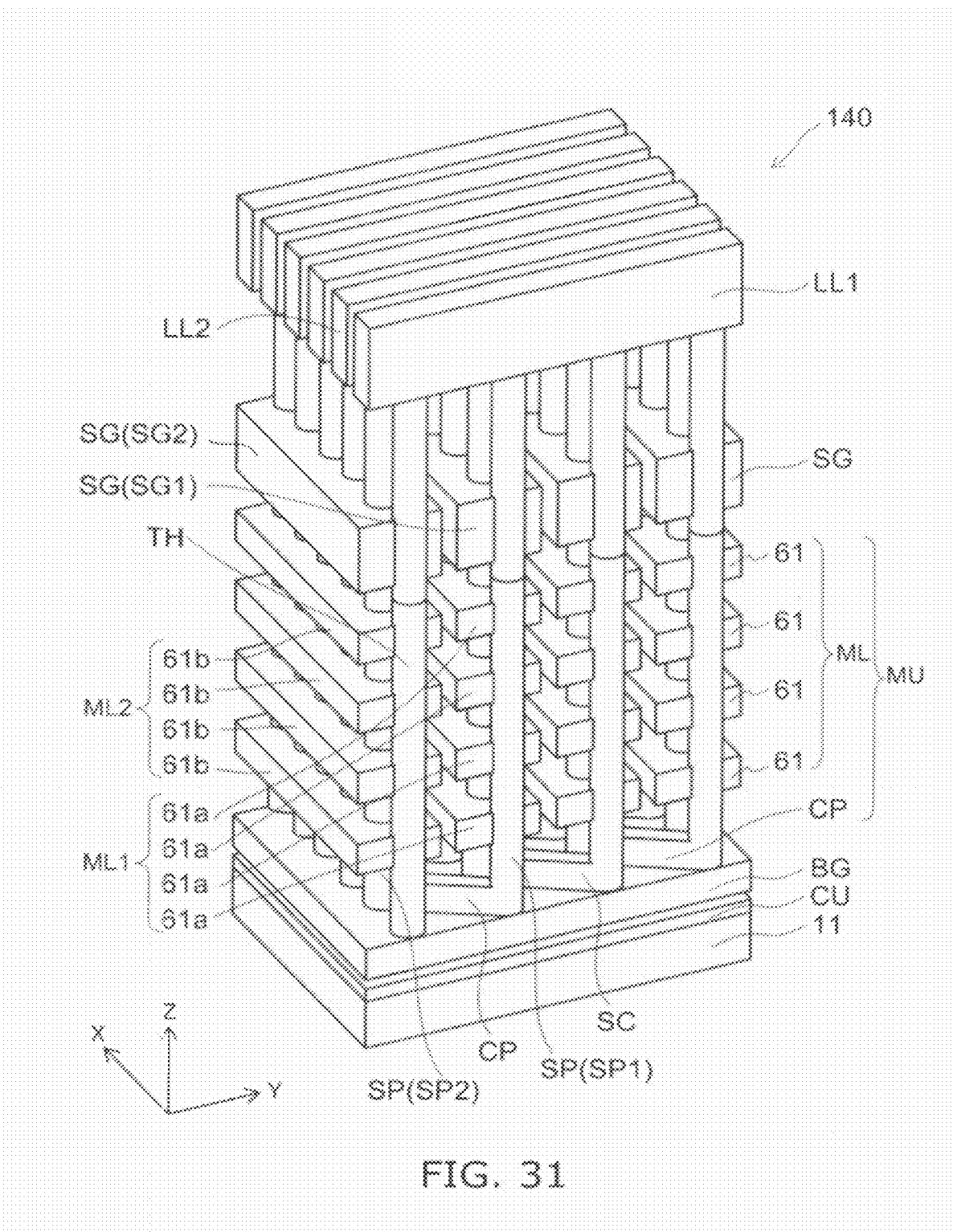
FIG. 31 is a schematic perspective view illustrating the configuration of a nonvolatile semiconductor memory device according to a fourth embodiment.

FIG. 31 is a schematic perspective view illustrating the configuration of a nonvolatile semiconductor memory device according to a fourth embodiment.

For easier viewing of the drawing, FIG. 31 illustrates only conductive portions and omits insulating portions.

As illustrated in FIG. 31, also a nonvolatile semiconductor memory device 140 according to this embodiment includes the first stacked structure body ML1, the second stacked structure body ML2, the first semiconductor pillar SP1, the second semiconductor pillar SP2, and the semiconductor connection portion CP.

The first stacked structure body ML1 includes the plurality of first electrode films 61a and the plurality of first inter-electrode insulating films 62a alternately stacked along the Z-axis direction (first direction). The second stacked structure body ML2 includes the plurality of second electrode films 61b and the plurality of second inter-electrode insulating films 62b alternately stacked along the Z-axis direction.

The first semiconductor pillar SP1 pierces the first stacked structure body ML1 along the Z-axis direction. The second semiconductor pillar SP2 pierces the second stacked structure body ML2 along the Z-axis direction.

The semiconductor connection portion CP connects one end of the first semiconductor pillar SP1 and one end of the second semiconductor pillar SP2.

The direction in which the first semiconductor pillar SP1 and the second semiconductor pillar SP2 are opposed is set to the Y-axis direction. The semiconductor connection portion CP extends along the Y-axis direction.

On the other hand, the first electrode film 61a and the second electrode film 61b extend in a direction that is perpendicular to the Z-axis direction and intersects with the Y-axis direction.

The nonvolatile semiconductor memory device 140 further includes the first select gate electrode SG1 and the second select gate electrode SG2. The first select gate electrode SG1 is stacked with the first stacked structure body ML1 in the first direction and is pierced by the first semiconductor pillar SP1. The second select gate electrode SG2 is stacked with the second stacked structure body ML2 in the first direction and is pierced by the second semiconductor pillar SP2. The first select gate electrode SG1 and the second select gate electrode SG2 have strip shapes extending along the direction in which the first electrode films 61a and the second electrode films 61b extend.

The nonvolatile semiconductor memory device 140 further includes a first conductive interconnection LL1 and a second conductive interconnection LL2. The first conductive interconnection LL1 is electrically connected to the other end of the first semiconductor pillar SP1. The second conductive interconnection LL2 is electrically connected to the other end of the second semiconductor pillar SP2. The first conductive interconnection LL1 is connected to, for example, the source line. The second conductive interconnection LL2 is connected to, for example, the bit line.

The first conductive interconnection LL1 and the second conductive interconnection LL2 extend in the direction perpendicular to the Z-axis direction and perpendicular to the direction in which the first electrode film 61a and the second electrode film 61b extend.

That is, the first semiconductor pillar SP1 and the second semiconductor pillar SP2 aligned in a direction oblique to the direction in which the first electrode film 61a and the second electrode film 61b extend and oblique to the direction in which the first conductive interconnection LL1 and the second conductive interconnection LL2 extend are connected by the semiconductor connection portion CP.

Also in the nonvolatile semiconductor memory device 140 with such a configuration, the configuration described in regard to the first and second embodiments may be used.

That is, also in the nonvolatile semiconductor memory device 140, the semiconductor connection portion CP does not include a portion smaller than the semiconductor pillar diameter xs. Furthermore, the semiconductor connection portion CP may not include a portion smaller than the end connection portion width xc.

The first protrusion CPP1 and the second protrusion CPP2, in addition to the end connection portion CPE, are provided in the semiconductor connection portion CP.

The position in the X-axis direction of the center CPEc in the X-axis direction of the end connection portion CPE shifts from the position in the X-axis direction of the center SPc in the X-axis direction of the first semiconductor pillar SP1 along the X-axis direction by, for example, the shift amount xcs.

Further, the depth (the protrusion depth zp) of the first protrusion CPP1 satisfies Formula 11 to Formula 14.

Furthermore, the first additional hole AH1 and the second additional hole AH2, in addition to the first through hole TH1 and the second through hole TH2, are provided in the nonvolatile semiconductor memory device 140. The memory hole MH includes the first through hole TH1, the second through hole TH2, the trench TR, the first additional hole AH1, and the second additional hole AH2.

The memory hole MH does not include a portion smaller than the through hole diameter xh. Further, the memory hole MH may not include a portion smaller than the trench width xt. For example, the additional hole depth za of the first additional hole AH1 and the second additional hole AH2 satisfies Formula 4 to Formula 7.

Thereby, the interior of the memory hole MH can be filled with the stacked insulating film 47 and the semiconductor layer SPf sufficiently and uniformly.

Fifth Embodiment

Figure 32:
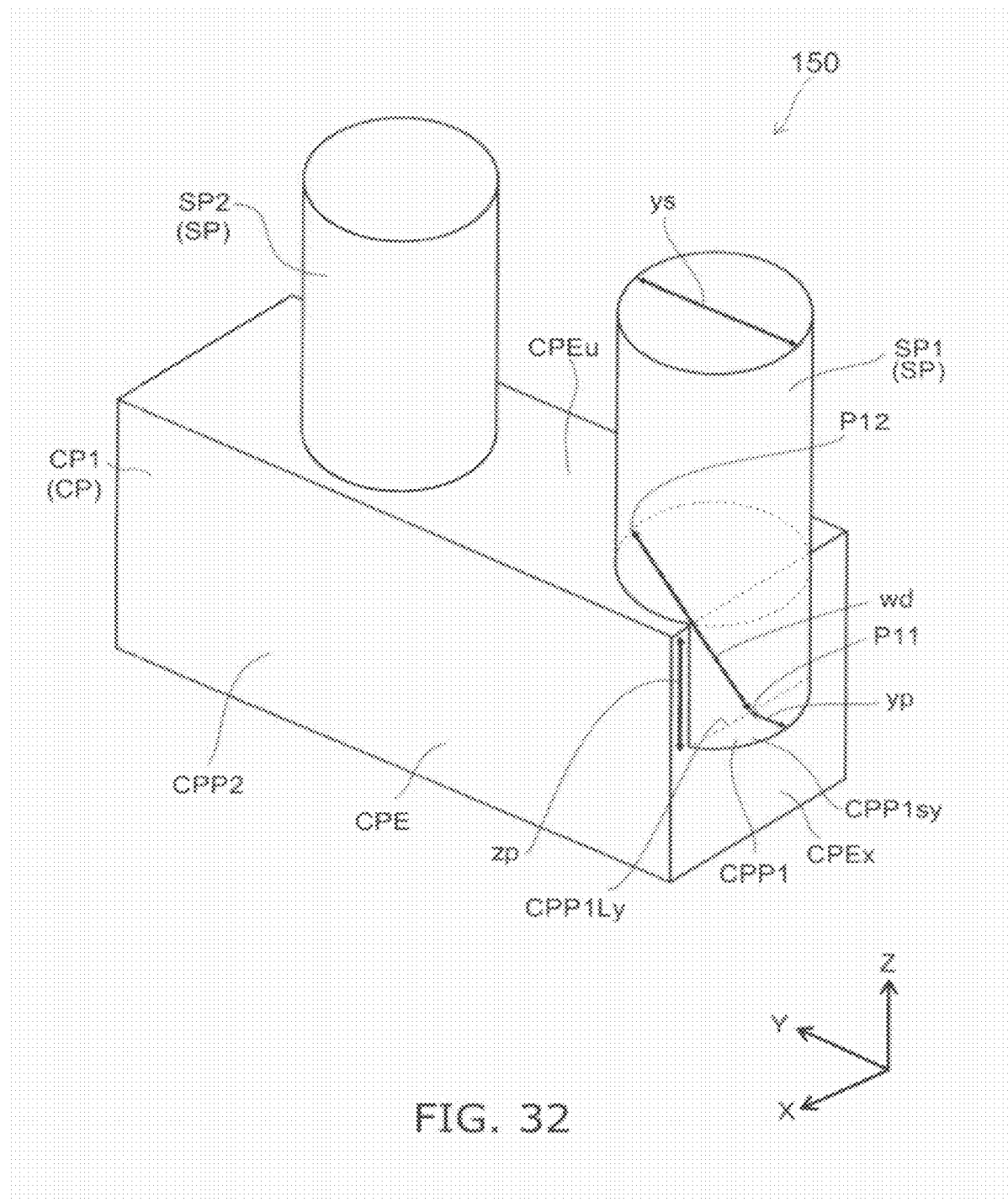
FIG. 32 is a schematic perspective view illustrating the configuration of a nonvolatile semiconductor memory device according to a fifth embodiment.

FIG. 32 is a schematic perspective view illustrating the configuration of a nonvolatile semiconductor memory device according to a fifth embodiment.

The drawing illustrates the portion of the first semiconductor pillar SP1, the second semiconductor pillar SP2, and the semiconductor connection portion CP (first semiconductor connection portion) of a nonvolatile semiconductor memory device 150 according to this embodiment.

As illustrated in FIG. 32, the semiconductor connection portion CP includes the end connection portion CPE and the first protrusion CPP1. That is, the nonvolatile semiconductor memory device 150 does not include the second protrusion CPP2. The first protrusion CPP1 protrudes from the end connection portion CPE along the Y-axis direction.

The end connection portion CPE has a connection portion side face CPEx along the X-axis direction. One end of the first semiconductor pillar SP1 is connected to the end connection portion CPE at the upper face CPEu of the end connection portion CPE. One end of the second semiconductor pillar SP2 is connected to the end connection portion CPE at the upper face CPEu of the end connection portion CPE. The end connection portion CPE extends along the Y-axis direction.

The first protrusion CPP1 is provided at the connection portion side face CPEx along the X-axis direction. The first protrusion CPP1 protrudes at the connection portion side face CPEx in a direction intersecting with the Z-axis direction.

The first protrusion CPP1 has a side face continuous with a side face along the Z-axis direction of the first semiconductor pillar SP1.

The nonvolatile semiconductor memory device 150 with such a configuration corresponds to the case where the first through hole TH1 corresponding to the first semiconductor pillar SP1 and the second through hole TH2 corresponding to the second semiconductor pillar SP2, and the semiconductor connection portion CP (the end connection portion CPE) shift from each other along the Y-axis direction. Also in this case, the first protrusion CPP1 is formed by forming the additional hole AH.

In this specific example, the distance wd between: the center P11 in the Y-axis direction of a first protrusion end line CPP1Ly at which a first protrusion end face CPP1sy of the first protrusion CPP1 on the side opposite to the first semiconductor pillar SP1 intersects with the connection portion side face CPEx; and the center P12 in the X-axis direction of a first periphery line CPEu1L on the side opposite to the first protrusion CPP1 of a first connection face CPEu1 of the end connection portion CPE in contact with the first semiconductor pillar SP1 corresponds to the width of a portion with a narrow width of the connection portion between the first semiconductor pillar SP1 and the end connection portion CPE.

By providing the first protrusion CPP1, the semiconductor connection portion CP does not include a portion smaller than the diameter (a semiconductor pillar diameter ys along the Y-axis direction) of the first semiconductor pillar SP.

The distance wd is set not less than the length (the semiconductor pillar diameter ys) along the Y-axis direction of the diameter of the first semiconductor pillar SP1. The distance wd is set not less than the width (the end connection portion width xc) along the X-axis direction of the end connection portion CPE.

Preferable conditions for the distance wd are found by the following: in Formula 8 to Formula 14, the distance we is replaced with the distance wd, the semiconductor pillar diameter xs is replaced with the semiconductor pillar diameter ys, the protrusion width xp is replaced with a protrusion width yp, the shift amount xcs along the X-axis direction is replaced with a shift amount ycs along the Y-axis direction, and the shift amount xht along the X-axis direction is replaced with a shift amount yht along the Y-axis direction.

Also the nonvolatile semiconductor memory device 150 provides a nonvolatile semiconductor memory device that can expand the allowable margin of mask alignment accuracy and dimensional accuracy.

The above is an example in which the first protrusion CPP1 protruding from the end connection portion CPE in the Y-axis direction is provided and the second protrusion CPP2 is not provided. However, it is also possible to provide the second protrusion CPP2 protruding from the end connection portion CPE along the Y-axis direction and not provide the first protrusion CPP1.

Furthermore, also a configuration is possible in which the first protrusion CCP1 protrudes from the end connection portion CPE along both of the Y-axis direction and the X-axis direction and the second protrusion CPP2 protruding along the X-axis direction is provided. Alternatively, a configuration is possible in which the second protrusion CPP2 protruding from the end connection portion CPE along both of the Y-axis direction and the X-axis direction is provided and the first protrusion CPP1 protruding from the end connection portion CPE along the X-axis direction is provided.

A stacked film of a plurality of films may be used for the sacrifice layer SCf used for the nonvolatile semiconductor memory device according to the embodiment. For example, a stacked film of a thin silicon oxide film and a silicon nitride film thicker than the silicon oxide film may be used as the sacrifice layer SCf. This improves, for example, process integration characteristics and processing characteristics.

For the electrode film 61 (the conductive film 61f) and the inter-electrode insulating film 62 (the insulating film 62f), a material selected from Si, polycrystalline Si, $SiO_2$, SiN, C (carbon), W, WSi, NiSi, TiSi, CoSi, $Al_2O_3$, and AlN may be used.

The following method, for example, may be used for the formation of the stacked structure body ML including the electrode film 61 and the inter-electrode insulating film 62: a first film and a second film with different etching rates are alternately stacked to form a stacked film; a pillar piercing the stacked film along the stack direction is formed; then, the first film, for example, of the stacked film is removed; and a material different from the second film is buried in the space between the remaining second films. For example, a silicon nitride film is used as the first film, and a polysilicon film is used as the second film. Then, the stacked film mentioned above is formed, the pillar is formed, then the first film is removed, and silicon oxide, for example, is buried in the space between the second films. In this example, the second film forms the electrode film 61 and the film of the silicon oxide forms the inter-electrode insulating film 62.

Thus, the process (step S140) that forms the stacked film MLf that forms the first stacked structure body ML1 and the second stacked structure body ML2 may include a process that alternately stacks the first film and the second film. The material of the first film is different from the material of the second film.

In the method for manufacturing a nonvolatile semiconductor memory device of the embodiment, multistep etching may be used for at least one of a first etching for the formation of the trench TR (step S120), a second etching for the formation of the through hole TH (step S150), and a third etching for the formation of the additional hole AH (step S160). This allows to perform processing with better controllability.

Although the case where silicon nitride is used as the memory layer 48 is described in the above, the embodiment is not limited thereto, but for the memory layer 48, a single layer film of one selected from a group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate or a stacked film formed of two or more selected from the group may be used.

Furthermore, for the inter-electrode insulating film 62, the inner insulating film 42, and the outer insulating film 43, a single layer film of one selected from a group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate or a stacked film formed of two or more selected from the group may be used.

In the specification of the application, "perpendicular" and "parallel" refer to not only strictly perpendicular and strictly parallel but also include, for example, the variation due to manufacturing processes, etc. It is sufficient to be substantially perpendicular and substantially parallel.

As described above, the embodiment provides a nonvolatile semiconductor memory device that can expand the allowable margin of mask alignment accuracy and dimensional accuracy and a method for manufacturing the same.

Hereinabove, embodiments of the invention are described with reference to specific examples. However, the invention is not limited to these specific examples. For example, one skilled in the art may appropriately select specific configurations of components of nonvolatile semiconductor memory devices such as electrode films, inter-electrode insulating films, select gate electrodes, semiconductor pillars, through holes, trenches, semiconductor connection portions, protrusion portions, connection portion conductive films, memory layers, inner insulating films, outer insulating films, insulating films, conductive films, interlayer insulating films, source lines, bit lines, and interconnections from known art and similarly practice the invention. Such practice is included in the scope of the invention to the extent that similar effects thereto can be obtained.

Further, any two or more components of the specific examples may be combined within the extent of technical feasibility; and such combinations also are included in the scope of the invention to the extent that the purport of the invention is included.

Moreover, all nonvolatile semiconductor memory devices and methods for manufacturing the same practicable by an appropriate design modification by one skilled in the art based on the nonvolatile semiconductor memory devices and the methods for manufacturing the same described above as embodiments of the invention also are within the scope of the invention to the extent that the purport of the invention is included.

Furthermore, various alterations and modifications within the spirit of the invention will be readily apparent to those skilled in the art. All such alterations and modifications should be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device comprising:
    a first stacked structure body including a plurality of first electrode films and a plurality of first inter-electrode insulating films alternately stacked in a first direction;
    a second stacked structure body aligned with the first stacked structure body in a direction perpendicular to the first direction and including a plurality of second electrode films and a plurality of second inter-electrode insulating films alternately stacked in the first direction;
    a first semiconductor pillar piercing the first stacked structure body along the first direction;
    a second semiconductor pillar piercing the second stacked structure body along the first direction and aligned with the first semiconductor pillar along a second direction perpendicular to the first direction;
    a first memory unit provided between the plurality of first electrode films and the first semiconductor pillar;
    a second memory unit provided between the plurality of second electrode films and the second semiconductor pillar; and a semiconductor connection portion connecting one end of the first semiconductor pillar and one end of the second semiconductor pillar, the semiconductor connection portion including:
- an end connection portion having a connection portion side face along the second direction; and
- a first protrusion protruding at the connection portion side face in a direction intersecting with the first direction and having a side face continuous with a side face of the first semiconductor pillar along the first direction, and the semiconductor connection portion not including a portion smaller than a diameter of the first semiconductor pillar.

2. The device according to claim 1, wherein the semiconductor connection portion protrudes at the connection portion side face in the direction intersecting with the first direction and the semiconductor connection portion further includes a second protrusion having a side face continuous with a side face of the second semiconductor pillar along the first direction.

3. The device according to claim 1, wherein a position in a third direction perpendicular to the first direction and the second direction of a center in the third direction of the end connection portion shifts from a position in the third direction of a center in the third direction of the first semiconductor pillar along the third direction.

4. The device according to claim 1, wherein a distance between a center in the second direction of a first protrusion end line at which a first protrusion end face of the first protrusion on a side opposite to the first semiconductor pillar intersects with the connection portion side face and a center in the second direction of a first periphery line on a side opposite to the first protrusion of a first connection face of the end connection portion in contact with the first semiconductor pillar is not less than a length along a third direction perpendicular to the first direction and the second direction of the diameter of the first semiconductor pillar.

5. The device according to claim 1, wherein a distance between a center in the second direction of a first protrusion end line at which a first protrusion end face of the first protrusion on a side opposite to the first semiconductor pillar intersects with the connection portion side face and a center in the second direction of a first periphery line on a side opposite to the first protrusion of a first connection face of the end connection portion in contact with the first semiconductor pillar is not less than a width along a third direction perpendicular to the first direction and the second direction of the end connection portion.

6. The device according to claim 1, wherein $$zp \geq (xs^2-(xs-xp)^2)^{1/2}$$

is satisfied,
where zp is a length along the first direction of the first protrusion,
xp is a maximum distance along a third direction perpendicular to the first direction and the second direction between the side face of the first protrusion and the connection portion side face, and
xs is a length along the third direction of the diameter of the first semiconductor pillar.

7. The device according to claim 1, wherein $$zp \geq (xs^2-((xs+xc)/2-xcs)^2)^{1/2}$$

is satisfied,
where zp is a length along the first direction of the first protrusion,
xs is a length along a third direction perpendicular to the first direction and the second direction of the diameter of the first semiconductor pillar,
xc is a width along the third direction of the end connection portion, and
xcs is a distance along the third direction between a center in the third direction of the end connection portion and a center in the third direction of the first semiconductor pillar.

8. The device according to claim 7, wherein the xs is not more than the xc.

9. The device according to claim 1, wherein $$zp \geq (xc^2-(xs-xp)^2)^{1/2}$$

is satisfied,
where zp is a length along the first direction of the first protrusion,
xp is a maximum distance along a third direction perpendicular to the first direction and the second direction between the side face of the first protrusion and the connection portion side face,
xs is a length along the third direction of the diameter of the first semiconductor pillar, and
xc is a width along the third direction of the end connection portion.

10. The device according to claim 9, wherein the xc is not more than the xs.

11. The device according to claim 1, wherein $$zp \geq (xc^2-((xs+xc)/2-xcs)^2)^{1/2}$$

is satisfied,
where zp is a length along the first direction of the first protrusion,
xs is a length along a third direction perpendicular to the first direction and the second direction of the diameter of the first semiconductor pillar,
xc is a width along the third direction of the end connection portion, and
xcs is a distance along the third direction between a center in the third direction of the end connection portion and a center in the third direction of the first semiconductor pillar.

12. A method for manufacturing a nonvolatile semiconductor memory device,
the device including:
- a first stacked structure body including a plurality of first electrode films and a plurality of first inter-electrode insulating films alternately stacked in a first direction;
- a second stacked structure body aligned with the first stacked structure body in a direction perpendicular to the first direction and including a plurality of second electrode films and a plurality of second inter-electrode insulating films alternately stacked in the first direction;
- a first semiconductor pillar piercing the first stacked structure body along the first direction;
- a second semiconductor pillar piercing the second stacked structure body along the first direction and aligned with the first semiconductor pillar along a second direction perpendicular to the first direction;
- a first memory unit provided between the plurality of first electrode films and the first semiconductor pillar;
- a second memory unit provided between the plurality of second electrode films and the second semiconductor pillar; and
- a semiconductor connection portion connecting one end of the first semiconductor pillar and one end of the second semiconductor pillar, the method comprising:

forming an underlayer on a substrate;

forming a trench in a region of the underlayer in which the semiconductor connection portion is to be formed and burying a sacrifice layer in the trench;

forming a stacked film serving as the first stacked structure body and the second stacked structure body on the underlayer and the sacrifice layer;

forming a first through hole piercing the stacked film along the first direction in a position corresponding to the first semiconductor pillar and reaching the sacrifice layer and a second through hole piercing the stacked film along the first direction in a position corresponding to the second semiconductor pillar and reaching the sacrifice layer;

removing at least a part of the underlayer exposed from the first through hole to form a first additional hole and removing at least a part of the underlayer exposed from the second through hole to form a second additional hole;

removing the sacrifice layer via the first through hole and the second through hole to form a memory hole including the first through hole, the second through hole, the trench, the first additional hole, and the second additional hole; and forming an insulating film serving as the first memory unit and the second memory unit on a wall face of the memory hole and forming a semiconductor layer serving as the first semiconductor pillar, the second semiconductor pillar, and the semiconductor connection portion in a remaining space of the memory hole, and the memory hole not including a portion smaller than a diameter of the first through hole.

13. The method according to claim 12, wherein a position in a third direction perpendicular to the first direction and the second direction of a center in the third direction of the trench shifts from a position in the third direction of a center in the third direction of the first through hole along the third direction.

14. The method according to claim 12, wherein a distance between a center in the second direction of a line segment of a contact between the underlayer and the sacrifice layer at a bottom face of the first additional hole and a center in the second direction of a lowermost end of a side wall of the first through hole on a side opposite to the first additional hole in a third direction perpendicular to the first direction and the second direction is not less than a length along the third direction of the diameter of the first through hole.

15. The method according to claim 12, wherein a distance between a center in the second direction of a line segment of a contact between the underlayer and the sacrifice layer at a bottom face of the first additional hole and a center in the second direction of a lowermost end of a side wall of the first through hole on a side opposite to the first additional hole in a third direction perpendicular to the first direction and the second direction is not less than a width along the third direction of the trench.

16. The method according to claim 12, wherein $$za \geq (xh^2-((xh+xt)/2-xht)^2)^{1/2}$$

is satisfied, where za is a depth of the first additional hole from an upper face of the underlayer, xh is a length along a third direction perpendicular to the first direction and the second direction of the diameter of the first through hole, xt is a width along the third direction of the trench, and xht is a distance along the third direction between a center in the third direction of the trench and a center in the third direction of the first through hole.

17. The method according to claim 16, wherein the xh is not more than the xt.

18. The method according to claim 12, wherein $$za \geq (xt^2-((xh+xt)/2-xht)^2)^{1/2}$$

is satisfied, where za is a depth of the first additional hole from an upper face of the underlayer, xh is a length along a third direction perpendicular to the first direction and the second direction of the diameter of the first through hole, xt is a width along the third direction of the trench, and xht is a distance along the third direction between a center in the third direction of the trench and a center in the third direction of the first through hole.

19. The method according to claim 18, wherein the xt is not more than the xh.

20. The method according to claim 12, wherein the forming the first additional hole and the forming the second additional hole includes removing at least a portion of the sacrifice layer exposed from the first through hole and the second through hole.

* * * * *